(12) United States Patent
Kim et al.

(10) Patent No.: US 11,545,224 B2
(45) Date of Patent: Jan. 3, 2023

(54) NONVOLATILE MEMORY DEVICE AND OPERATING METHOD OF THE SAME

(71) Applicant: Samsung Electronics Co., Ltd., Suwon-si (KR)

(72) Inventors: Yumin Kim, Seoul (KR); Seyun Kim, Seoul (KR); Jinhong Kim, Seoul (KR); Soichiro Mizusaki, Suwon-si (KR); Youngjin Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/306,302

(22) Filed: May 3, 2021

(65) Prior Publication Data
US 2022/0020437 A1  Jan. 20, 2022

(30) Foreign Application Priority Data
Jul. 14, 2020  (KR) .................. 10-2020-0086911

(51) Int. Cl.
| G11C 16/26 | (2006.01) |
| G11C 16/30 | (2006.01) |
| G11C 5/06 | (2006.01) |
| G11C 16/14 | (2006.01) |
| G11C 16/04 | (2006.01) |
| G11C 16/24 | (2006.01) |

(52) U.S. Cl.
CPC .............. *G11C 16/26* (2013.01); *G11C 5/06* (2013.01); *G11C 16/0433* (2013.01); *G11C 16/14* (2013.01); *G11C 16/24* (2013.01); *G11C 16/30* (2013.01)

(58) Field of Classification Search
CPC ....... G11C 16/26; G11C 5/06; G11C 16/0433; G11C 16/14; G11C 16/24; G11C 16/30; G11C 13/0069; G11C 5/025; G11C 2213/71; G11C 2213/75; G11C 13/0026; G11C 13/0004; G11C 13/0097; H01L 27/2454; H01L 27/249; H01L 45/08; H01L 45/10; H01L 45/1233; H01L 45/144; H01L 45/145; H01L 45/146
USPC ...................... 365/189.011, 185.24
See application file for complete search history.

(56) References Cited

U.S. PATENT DOCUMENTS

| 8,085,583 | B2 | 12/2011 | Suh |
| 8,406,034 | B2 | 3/2013 | Murooka |
| 9,966,136 | B2 | 5/2018 | Ogiwara et al. |
| 10,269,570 | B2 * | 4/2019 | Lee ................. G11C 16/3459 |

(Continued)

OTHER PUBLICATIONS

Kyungsoo Jang et al., "Improvement of Electrical Performance in P-Channel LTPS Thin-Film Transistor with a-Si:H Surface Passivation" Materials (2019) 12, 161.

*Primary Examiner* — Michael T Tran
(74) *Attorney, Agent, or Firm* — Harness, Dickey & Pierce, P.L.C.

(57) ABSTRACT

A nonvolatile memory device and an operating method thereof are provided. The nonvolatile memory device includes a memory cell array including first to third memory cells sequentially arranged in a vertical stack structure and a control logic configured to apply a first non-selection voltage to the first memory cell, apply a second non-selection voltage different from the first non-selection voltage to the third memory cell, apply a selection voltage to the second memory cell, and select the second memory cell as a selection memory cell.

19 Claims, 19 Drawing Sheets

(56) References Cited

U.S. PATENT DOCUMENTS

| | | | |
|---|---|---|---|
| 10,490,244 B2 | 11/2019 | Oh | |
| 10,510,413 B1* | 12/2019 | Diep | G11C 16/34 |
| 10,832,778 B1* | 11/2020 | Yang | G11C 16/344 |
| 11,342,006 B2* | 5/2022 | Sakakibara | G11C 16/24 |
| 2004/0027856 A1* | 2/2004 | Lee | G11C 16/0408 |
| | | | 365/185.11 |
| 2008/0239799 A1 | 10/2008 | Watanabe | |
| 2012/0063223 A1* | 3/2012 | Lee | G11C 16/3436 |
| | | | 365/185.05 |
| 2014/0192594 A1* | 7/2014 | Lue | G11C 16/0466 |
| | | | 365/185.11 |
| 2014/0247663 A1* | 9/2014 | Yuan | G11C 16/3413 |
| | | | 365/185.17 |
| 2014/0293708 A1* | 10/2014 | Kwon | H01L 27/1157 |
| | | | 365/185.23 |
| 2015/0303204 A1* | 10/2015 | Kwon | H01L 27/11568 |
| | | | 438/287 |
| 2015/0318045 A1* | 11/2015 | Yun | G11C 16/30 |
| | | | 365/185.25 |
| 2016/0071595 A1* | 3/2016 | Dong | G11C 16/10 |
| | | | 365/185.17 |
| 2017/0076815 A1* | 3/2017 | Suzuki | G11C 16/24 |
| 2018/0040362 A1* | 2/2018 | Kwak | G11C 16/10 |
| 2018/0315479 A1* | 11/2018 | Lee | G11C 16/30 |
| 2019/0035478 A1* | 1/2019 | Lee | G11C 7/04 |
| 2019/0066793 A1* | 2/2019 | Shin | G11C 16/0483 |
| 2019/0139615 A1* | 5/2019 | Ku | G11C 16/3445 |
| 2019/0295657 A1* | 9/2019 | Maejima | G11C 16/26 |
| 2019/0362799 A1* | 11/2019 | Yang | G11C 11/5628 |
| 2019/0385658 A1* | 12/2019 | Lee | G11C 16/24 |
| 2020/0202964 A1* | 6/2020 | Sako | G11C 16/24 |
| 2020/0258580 A1* | 8/2020 | Park | G11C 16/0483 |
| 2021/0174881 A1* | 6/2021 | Sakakibara | G11C 11/5628 |
| 2022/0108729 A1* | 4/2022 | Ogiwara | G11C 7/1069 |
| 2022/0130474 A1* | 4/2022 | Choi | G11C 16/10 |

\* cited by examiner

NONVOLATILE MEMORY DEVICE AND OPERATING METHOD OF THE SAME

CROSS-REFERENCE TO RELATED APPLICATION

This application is based on and claims priority under 35 U.S.C. § 119 to Korean Patent Application No. 10-2020-0086911, filed on Jul. 14, 2020, in the Korean Intellectual Property Office, the disclosure of which is incorporated by reference herein in its entirety.

BACKGROUND

1. Field

The present disclosure relates to nonvolatile memory devices and operating methods thereof.

2. Description of Related Art

A nonvolatile memory device is a semiconductor memory device that retains information even when power is turned off. The nonvolatile memory device includes a plurality of memory cells capable of using stored information again when power is resupplied. Nonvolatile memory devices may be used in mobile phones, digital cameras, portable information terminals (PDAs), mobile computer devices, stationary computer devices, and other devices.

In recent years, research on the use of 3-dimensional (3D) (or vertical) NAND (VNAND) for a chip forming a next-generation neuromorphic computing platform or a neural network has been conducted.

In particular, technology may be needed to obtain high integration and low power characteristics and to enable random access to memory cells.

SUMMARY

Provided are nonvolatile memory devices with adjustable rectifying characteristics and/or operating methods thereof.

Additional aspects will be set forth in part in the description which follows and, in part, will be apparent from the description, or may be learned by practice of the presented embodiments of the disclosure.

According to an embodiment, a nonvolatile memory device includes a memory cell array including a first memory cell, a second memory cell, and a third memory cell sequentially arranged in a vertical stack structure; a control logic configured to select the second memory cell as a selection memory cell by applying a first non-selection voltage to the first memory cell, applying a second non-selection voltage different from the first non-selection voltage to the third memory cell and applying a selection voltage to the second memory cell; and a bit line connected to the memory cell array and configured to apply an operation voltage to the memory cell array.

In some embodiments, the control logic may be further configured to apply the first and second non-selection voltages to the first and third memory cells, respectively, such that a semiconducting layer included in the first memory cell and a semiconducting layer included in the third memory cell have different Fermi levels in response to the first non-selection voltage being applied to the first memory cell and the second non-selection voltage being applied to the third memory cell.

In some embodiments, a difference between the first non-selection voltage and the second non-selection voltage may be less than a difference between the first non-selection voltage and the selection voltage.

In some embodiments, a difference between the first non-selection voltage and the second non-selection voltage may be greater than or equal to about 2V.

In some embodiments, the first non-selection voltage and the second non-selection voltage may have different absolute values.

In some embodiments, the first non-selection voltage and the second non-selection voltage may have different directions.

In some embodiments, the first non-selection voltage may be greater than or equal to 0V and less than or equal to about 7V.

In some embodiments, the second non-selection voltage may be greater than or equal to about −15V and less than or equal to about −8V.

In some embodiments, the selection voltage may be less than the first non-selection voltage and greater than the second non-selection voltage.

In some embodiments, an absolute value of the selection voltage may be less than absolute values of the first non-selection voltage and the second non-selection voltage.

In some embodiments, the first to third memory cells may be connected in series to each other while being sequentially farther away from the bit line.

In some embodiments, the operation voltage may be a write voltage for writing data to the second memory cell or an erase voltage for erasing the data written to the second memory cell, and the write voltage and the erase voltage may have different signs and have the same absolute value.

In some embodiments, the memory cell array may include a semiconducting layer extending in a first direction; a plurality of gates and a plurality of insulating layers extending in a second direction perpendicular to the first direction and alternately disposed with each other; a gate insulating layer extending in the first direction between the plurality of gates, the plurality of insulating layers, and the semiconducting layer; and a resistance change layer extending in the first direction on the semiconducting layer.

In some embodiments, the semiconducting layer and the resistance change layer may be connected in parallel to each other.

In some embodiments, the resistance change layer may be in contact with the semiconducting layer.

In some embodiments, the semiconducting layer may not be doped with a dopant.

In some embodiments, the resistance change layer may have a hysteresis characteristic.

In some embodiments, the resistance change layer may include at least one of a transition metal oxide and a transition metal nitride.

According to an embodiment, an operating method of a nonvolatile memory device including a memory cell array is provided. The memory cell array includes a first memory cell, a second memory cell, and a third memory cell sequentially arranged in a vertical stack structure. The method may include selecting the second memory cell as a selection memory cell by applying a first non-selection voltage to the first memory cell, applying a second non-selection voltage different from the first non-selection voltage to the third memory cell and applying a selection voltage to the second memory cell; and applying an operation voltage to the memory cell array to perform any one of write, erase, and read operations on the second memory cell.

In some embodiments, the first non-selection voltage and the second non-selection voltage may have magnitudes such that a semiconducting layer included in the first memory cell and a semiconducting layer included in the third memory cell have different Fermi levels.

According to an embodiment, a nonvolatile memory device may include a substrate, a memory cell array including a plurality of memory cell strings spaced apart from each other on the substrate in at least one of a first direction and a second direction crossing the first direction, a plurality of bit lines connected to the memory cell array, and processing circuitry connected to the memory cell array through a plurality of a plurality of string selection lines and a plurality of word lines. Each of the plurality of memory cell strings may include a string selection transistor, a plurality of memory cells spaced apart from each other in a third direction over the string selection transistor, a resistance change layer extending in the third direction, and a semiconductor layer surrounding the resistance change layer. The plurality of memory cells may include a first memory cell, a second memory cell over the first memory cell, and a third memory cell over the second memory cell. Each of the plurality of memory cells may include a transistor and a resistor connected in parallel. The transistor may include a respective portion of the semiconductor layer as a channel. The resistor may be defined by a respective portion of the resistance change layer. The processing circuitry may be configured to perform an operation on the memory cell array, in response to an operation voltage being applied to a selected memory cell string among the plurality of memory cell strings using a selected bit line among the plurality of bit lines, by applying a first non-selection voltage to the first memory cell of the selected memory cell string using a first word line among the plurality of word lines, applying a selection voltage to the second memory cell of the selected memory cell string using a second word line among the plurality of word lines, applying a second non-selection voltage to the third memory cell of the selected memory cell string using a third word line among the plurality of word lines, and applying a third selection voltage to the string selection transistor of the selected memory cell string. The first non-selection voltage, the selection voltage, and the second non-selection voltage may be different from each other.

In some embodiments, the operation voltage may be a write voltage, a read voltage, or an erase voltage.

In some embodiments, the first non-selection voltage may be greater than or equal to 0V and less than or equal to about 7V. The second non-selection voltage may be greater than or equal to about −15V and less than or equal to about −8V. An absolute value of the selection voltage may be less than absolute values of the first non-selection voltage and the second non-selection voltage.

In some embodiments, the semiconductor layer may not be doped with a dopant and the semiconductor layer may include silicon, Ge, IGZO, or GaAs. The resistance change layer may include GeSbTe or the resistance change layer may include an oxide or nitride of at least one element selected from the group consisting of zinc (Zn), zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), praseodymium (Pr) and silicon (Si).

In some embodiments, the semiconductor layer and the resistance change layer each may have a thickness of about 1 nm to about 15 nm.

BRIEF DESCRIPTION OF THE DRAWINGS

The above and other aspects, features, and effects of certain embodiments of the disclosure will be more apparent from the following description taken in conjunction with the accompanying drawings, in which.

DETAILED DESCRIPTION

Figure 1:
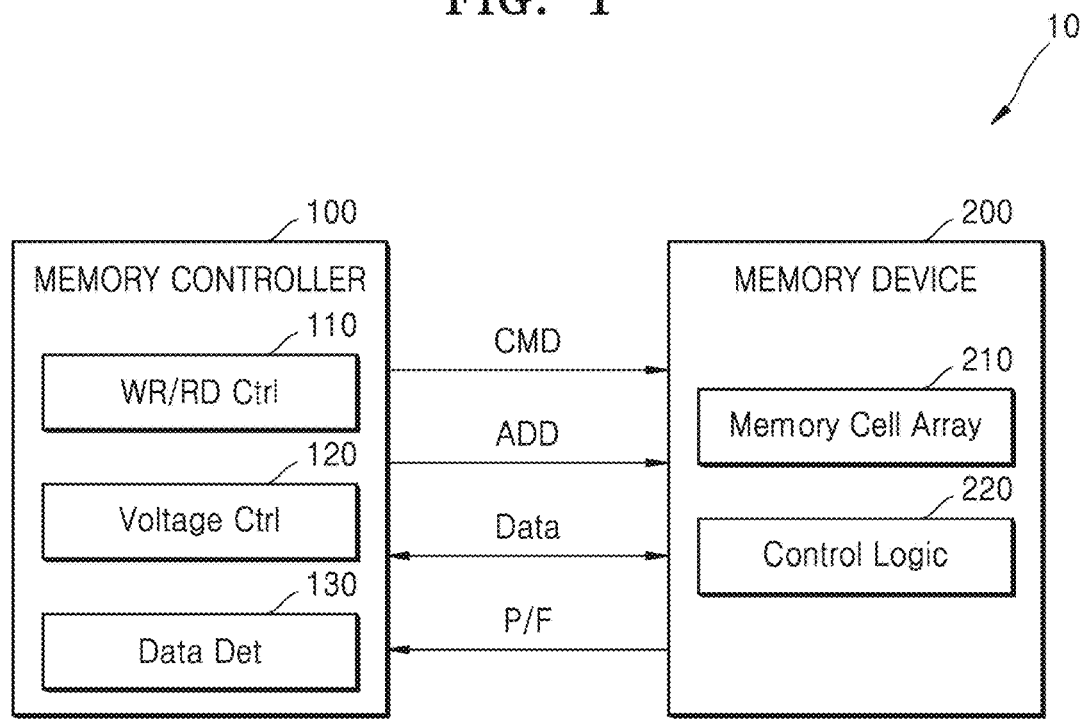
FIG. 1 is a block diagram illustrating a memory system according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

Phrases such as "in an embodiment" and "in an embodiment" in the present specification do not indicate the same embodiment of the disclosure.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The disclosure may be described in terms of functional block elements and various processing steps. Some or all functional blocks may be realized as any number of hardware and/or software elements configured to perform the specified functions. For example, the functional blocks may be realized by at least one microprocessor or circuits for performing certain functions. Also, the functional blocks may be realized with any programming or scripting language. The functional blocks may be realized in the various algorithms that are executed on one or more processors. Furthermore, the disclosure may employ any number of conventional techniques for electronics configuration, signal processing and/or control, data processing and the like. The words "mechanism", "element", "means", and "configuration" are used broadly and are not limited to mechanical or physical embodiments of the disclosure.

Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device.

As used herein, the terms 'comprising' or 'including' and the like should not be construed as necessarily including the various elements or operations described in the specification, and it should be understood that some of the elements or some of the operations may not be included, or that additional elements or operations may be further included.

In the following, what is described as "upper" or "on" may include not only those in contact with and directly above, below, left, and right but also those in non-contact with and directly above, below, left, and right. Hereinafter, the present disclosure will be described in detail with reference to the accompanying drawings by embodiments only for examples Terms including ordinals such as 'first' or 'second' may be used to describe various elements, but the elements should not be limited by the terms. The terms are only used for the purpose of distinguishing one element from another.

Hereinafter, the present disclosure will be described in detail with reference to the accompanying drawings.

FIG. 1 is a block diagram illustrating a memory system 10 according to an embodiment.

Referring to FIG. 1, the memory system 10 may include a memory controller 100 and a memory device 200. The memory controller 100 performs a control operation on the memory device 200. As an example, the memory controller 100 provides an address ADD and a command CMD to the memory device 200, thereby performing program (or write), read, and erase operations on the memory device 200. In addition, data for the write operation and read data may be transmitted and received between the memory controller 100 and the memory device 200. The memory device 200 may provide the memory controller 100 a pass/fail signal P/F according to a read result with respect to the read data. The memory controller 100 may refer to the pass/fail signal P/F and thus control write and read operations of the memory cell array 210.

The memory device 200 may include a memory cell array 210 and a voltage generator 222. The memory cell array 210 may include a plurality of memory cells disposed in regions where a plurality of word lines and a plurality of bit lines cross each other. The memory cell array 210 may include nonvolatile memory cells that store data in a nonvolatile manner, and as the nonvolatile memory cells, the memory cell array 210 may include flash memory cells such as a NAND flash memory cell array 210 or a NOR flash memory cell array 210. Hereinafter, embodiments of the present disclosure will be described in detail on the assumption that the memory cell array 210 includes the flash memory cell array 210 and thus the memory device 200 is a nonvolatile memory device.

The memory controller 100 may include a write/read controller 110, a voltage controller 120, and a data determiner 130.

The write/read controller 110 may generate the address ADD and the command CMD for performing the write/read and erase operations on the memory cell array 210. Further, the voltage controller 120 may generate a voltage control signal to control at least one voltage level used in the nonvolatile memory device 200. As an example, the voltage controller 120 may generate the voltage control signal for controlling a voltage level of a word line for reading data from the memory cell array 210 or writing data to the memory cell array 210.

Meanwhile, the data determiner 130 may perform a determination operation on the data read from the memory device 200. For example, the data determiner 130 may determine the number of on-cells and/or off-cells among the memory cells by determining data read from the memory cells. As an example of operation, when the write operation is performed on a plurality of memory cells, the data determiner 130 may determine the state of data of the memory cells by using a predetermined read voltage, thereby determining whether the write operation on the memory cells is normally completed.

Meanwhile, the memory device 200 may include a memory cell array 210 and a control logic 220. As described above, the memory cell array 210 may include nonvolatile memory cells, and as an example, the memory cell array 210 may include flash memory cells. In addition, flash memory cells may be implemented in various forms. For example, the memory cell array 210 may include three-dimensional (3D) (or vertical) NAND (VNAND) memory cells.

Figure 2:
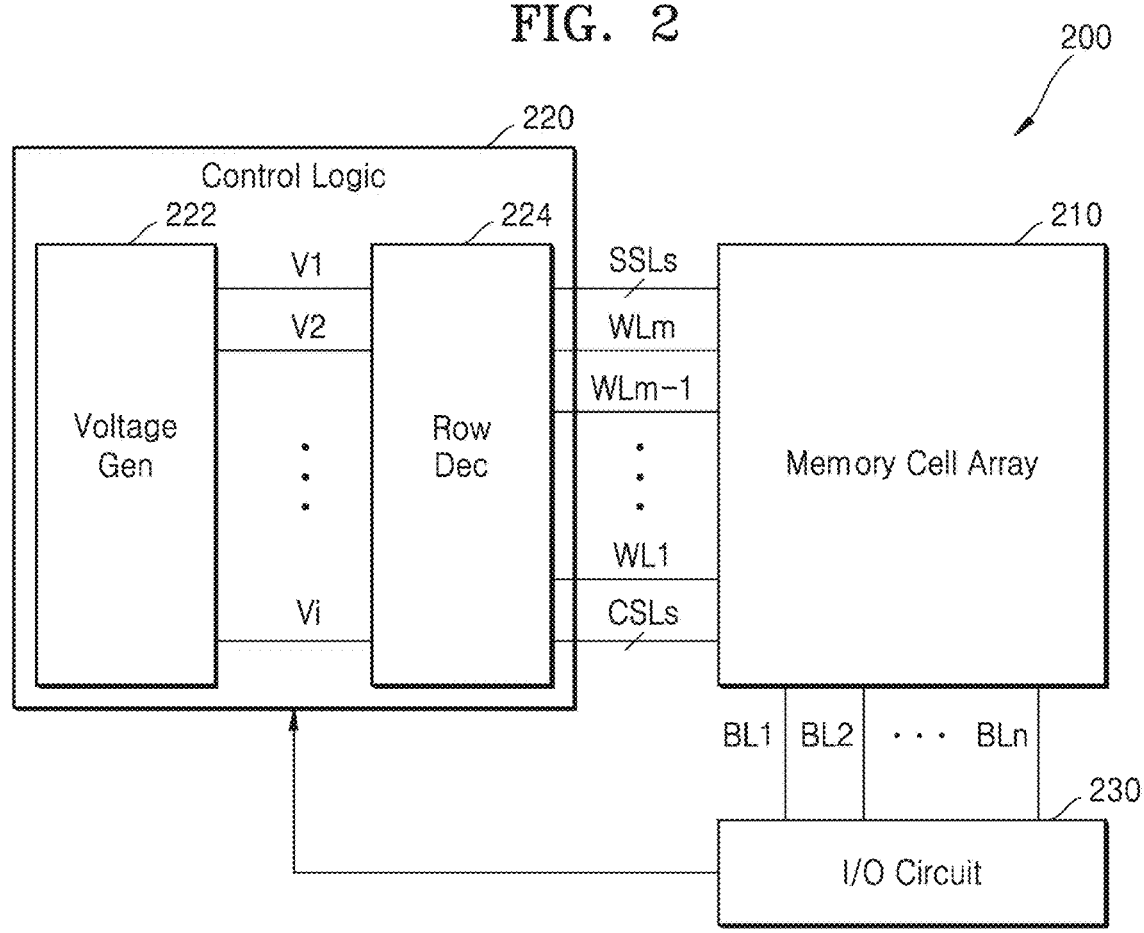
FIG. 2 is a block diagram illustrating an embodiment of the memory device of FIG. 1.

FIG. 2 is a block diagram illustrating an embodiment of the memory device 200 of FIG. 1.

As illustrated in FIG. 2, the control logic 220 of the memory device 200 may further include a voltage generator and a row decoder.

The memory cell array 210 may be connected to one or more string selection lines SSL, a plurality of word lines WL1 to WLm (including a normal word line and a dummy word line), one or more common source lines CSLs, and a plurality of bit lines BL1 to BLn.

The voltage generator 222 may generate one or more word line voltages V1 to Vi, and the word line voltages V1 to Vi may be provided to the row decoder 224. A signal for the write/read/erase operations may be applied to the memory cell array 210 through the bit lines BL1 to BLn.

In addition, data to be written may be provided to the memory cell array 210 through an input/output circuit 230, and the read data may be provided to the outside (for example, a memory controller) through the input/output circuit 230. The control logic 220 may provide various control signals related to a memory operation to the row decoder 224 and the voltage generator 222 under the control of the memory controller 100.

According to a decoding operation of the row decoder 224, the word line voltages V1 to Vi may be provided to various lines SSLs, WL1 to WLm, and CSLs. For example, the word line voltages V1 to Vi may include a string selection voltage, a word line voltage, and a ground selection voltage, and the string selection voltage may be provided to the one or more string selection lines SSLs, and the word line voltage may be provided to the one or more word line WL, and the ground selection voltage may be provided to the one or more common source lines CSLs.

Figure 3:
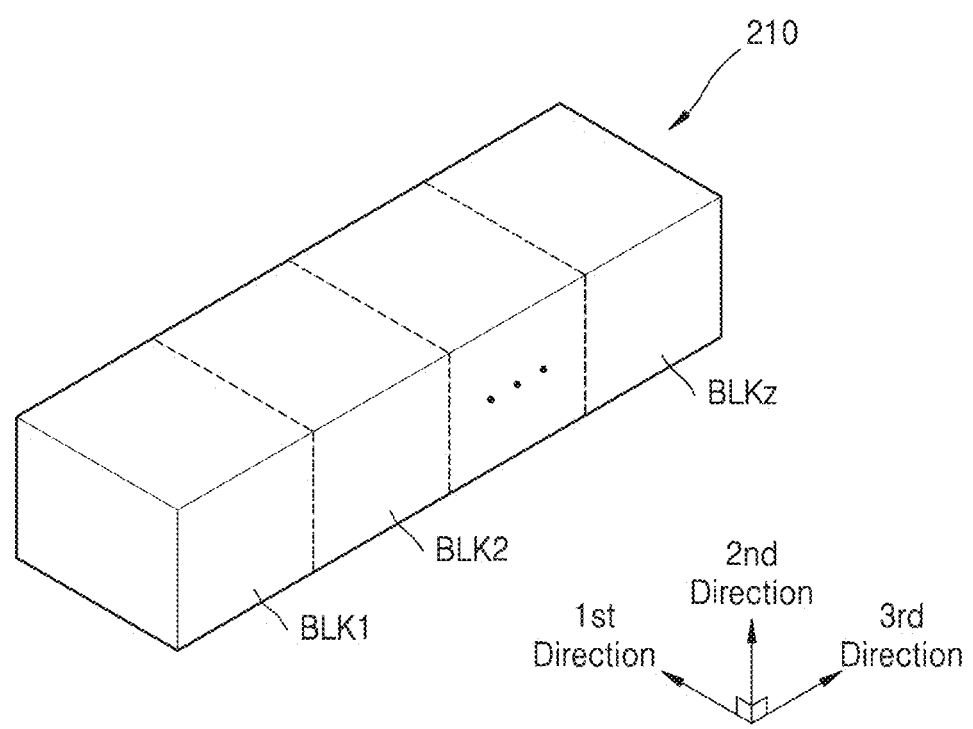
FIG. 3 is a block diagram illustrating a memory cell array according to FIG. 2.

FIG. 3 is a block diagram illustrating the memory cell array 210 according to FIG. 1.

Referring to FIG. 3, the memory cell array 210 includes a plurality of memory blocks BLK1 to BLKz. Each memory block BLK has a 3D structure (or a vertical structure). For example, each memory block BLK includes structures extending in first to third directions. For example, each memory block BLK includes a plurality of cell strings CSs extending in the second direction. For example, the plurality of cell strings CSs may be provided in the first and third directions.

Each cell string CS is connected to the bit line BL, the string selection line SSL, the word lines WLs, and the common source line CSL. That is, each of the memory blocks BLK1 to BLKz may be connected to the plurality of bit lines BL, the plurality of string selection lines SSLs, the plurality of word lines WLs and the plurality of common source lines CSLs. The memory blocks BLK1 to BLKz will be described in more detail with reference to FIG. 4.

Figure 4:
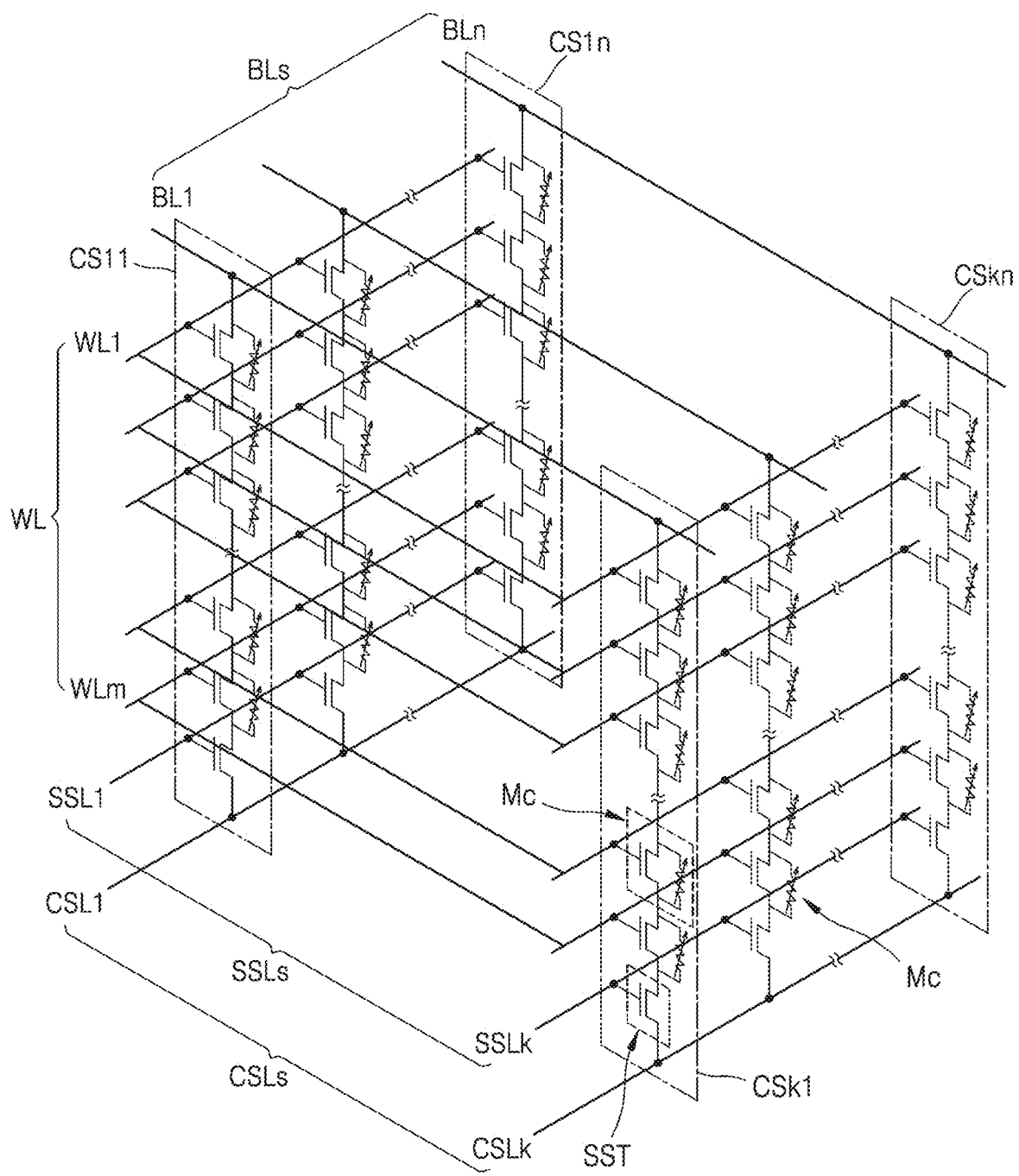
FIG. 4 is a diagram illustrating an equivalent circuit corresponding to a memory block according to an embodiment.

FIG. 4 is a diagram illustrating an equivalent circuit corresponding to a memory block BLKi according to an embodiment. For example, one of the memory blocks BLK1 to BLKz of the memory cell array 210 of FIG. 3 is shown in FIG. 4.

Referring to FIGS. 3 and 4, the memory block BLKi includes the plurality of cell strings CSs. The plurality of cell strings CSs may be arranged in a row direction and a column direction to form rows and columns.

Each cell string CS11 to CSkn includes memory cells MCs and a string selection transistor SST. The memory cells MCs and the string selection transistor SST of each cell string CS may be stacked in a height direction.

The rows of the plurality of cell strings CSs are connected to different string selection lines SSL1 to SSLk, respectively. For example, the string selection transistors SSTs of the cell strings CS11 to CS1n are commonly connected to the string selection line SSL1. The string selection transistors SST of the cell strings CSk1 to CSkn are commonly connected to a string selection line SSLk.

The columns of the plurality of cell strings CSs are connected to the different bit lines BL1 to BLn, respectively. For example, the memory cells of the cell strings CS11 to CSk1 and the string selection transistors SST may be commonly connected to the bit line BL1, and the memory cells and the string selection transistors SST of the cell strings CS1n to CSkn may be commonly connected to the bit line BLn.

The rows of the plurality of cell strings CSs may be connected to the different common source lines CSL1 to CSLk, respectively. For example, the string selection transistors SST of the cell strings CS11 to CS1n may be commonly connected to the common source line CSL1, and the string selection transistors SST of the cell strings CSk1 to CSkn may be commonly connected to the common source line CSLk.

The memory cells located at the same height from a substrate (or the string selection transistors SST) may be commonly connected to the one word line WL, and memory cells located at different heights may be connected to the different word lines WL1 to WLm respectively.

The memory block BLKi shown in FIG. 4 is exemplary. The technical idea of the present disclosure is not limited to the memory block BLKi illustrated in FIG. 4. For example, the number of rows of the cell strings CSs may increase or decrease. As the number of rows of the cell strings CSs changes, the number of string selection lines connected to the rows of the cell strings CSs and the number of cell strings CSs connected to one bit line may also change. As the number of rows of the cell strings CSs changes, the number of common source lines connected to the rows of the cell strings CSs may also change.

The number of columns of the cell strings CSs may increase or decrease. As the number of columns of the cell strings CSs changes, the number of bit lines connected to the columns of the cell strings CSs and the number of cell strings CSs connected to the one string selection line SSL may also change.

The height of the cell strings CSs may increase or decrease. For example, the number of memory cells stacked on each of the cell strings CSs may increase or decrease. As the number of memory cells stacked in each of the cell strings CSs changes, the number of word lines WL may also change. For example, the number of the string selection transistors SST provided to each of the cell strings CSs may increase. As the number of string selection transistors SST provided to each of the cell strings CSs changes, the number of string selection lines SST or common source lines CSL may also change. When the number of string selection transistors SST increases, the string selection transistors SST may be stacked in the same shape as the memory cells MCs.

For example, write and read operations may be performed in units of rows of the cell strings CSs. The cell strings CSs may be selected in units of one row by the common source lines CSLs, and the cell strings CSs may be selected in units of one row by the string selection lines SSLs. Also, a voltage may be applied to the common source lines CSLs as a unit of at least two common source lines. The voltage may be applied to the common source lines CSLs as a unit.

In the selected row of the cell strings CSs, the write and read operations may be performed in units of pages. The page may be one row of memory cells connected to one word line WL. In the selected row of cell strings CSs, memory cells may be selected in units of pages by the word lines WLs.

Meanwhile, each of the memory cells MCs may correspond to a circuit in which a transistor and a resistor are connected in parallel.

Figure 5:
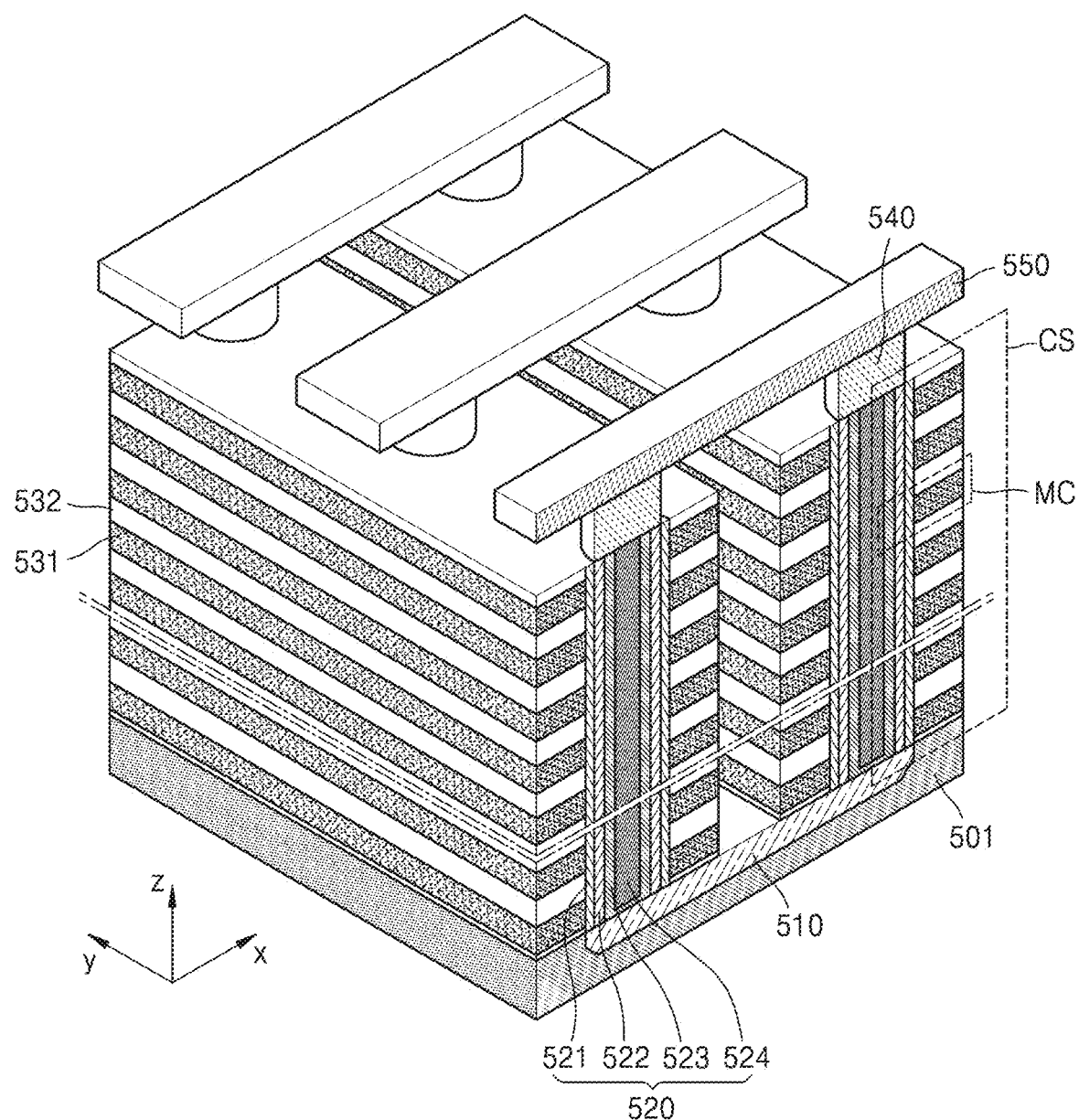
FIG. 5 is a diagram illustrating a physical structure corresponding to a memory block according to an embodiment.

FIG. 5 is a diagram illustrating a physical structure corresponding to a memory block according to an embodiment.

Referring to FIG. 5, first, a substrate 501 is provided. For example, the substrate 501 may include a silicon material doped with a first type impurity. For example, the substrate 501 may include a silicon material doped with p-type impurities. For example, the substrate 501 will be a p-type well (e.g., a pocket p well). Hereinafter, it is assumed that the substrate 501 is a p-type silicon. However, the substrate 501 is not limited to the p-type silicon.

A doping region 510 is provided on the substrate 501. For example, the doping region 510 will have a second type different from that of the substrate 501. For example, the doping region 510 will have an n-type. Hereinafter, it is assumed that the doping region 510 is the n-type. However, the doping region 510 is not limited to the n-type. The doping region 510 may be a common source line.

A plurality of gates 531 and a plurality of insulating layers 532 that extend in a horizontal direction may be alternately arranged on the substrate 501. That is, the plurality of gates 531 and the plurality of insulating layers 532 may be stacked to cross each other in a vertical direction perpendicular to a horizontal direction. For example, the gate 531 may include a metal material (e.g., copper, silver, etc.), and the plurality of insulating layers 532 may include silicon oxide, but is not limited thereto. Each gate 531 is connected to one of the word line WL and the string selection line SSL.

A pillar 520 penetrating the plurality of gates 531 and the plurality of insulating layers 532 which are alternately arranged in the vertical direction is provided.

The pillar 520 may include a plurality of layers. In an embodiment, the outermost layer of the pillar 520 may be a gate insulating layer 521. For example, the gate insulating layer 521 may include silicon oxide. The gate insulating layer 521 may be conformally deposited on the pillar 520. The gate insulating layer 521 may have a thickness of about 1 nm to about 15 nm.

In addition, a semiconducting layer 522 may be conformally deposited along the inner surface of the gate insulating layer 521. In an embodiment, the semiconducting layer 522 may include a silicon material. Alternatively, the semiconducting layer 522 may also include a material such as Ge, IGZO, and GaAs. The semiconducting layer 522 may not be doped with a dopant. Thus, the Fermi level of the semiconducting layer 522 may change according to the voltage applied to the gate 531. However, the present disclosure is not limited thereto. The semiconducting layer 522 may include a silicon material doped with the first type impurity. The semiconducting layer 522 may include the silicon material doped with the same type as the substrate 501. For example, when the substrate 501 includes a silicon material doped in a p-type, the semiconducting layer 522 may also include the silicon material doped with the p-type. The semiconducting layer 522 may have a thickness of about 1 nm to about 15 nm.

A resistance change layer 523 may be disposed along the inner surface of the semiconducting layer 522. The resistance change layer 523 may be disposed in contact with the semiconducting layer 522 and may be conformally deposited on the semiconducting layer 522. In an embodiment, the resistance change layer 523 may include a material of which resistance varies according to an applied voltage. The resistance change layer 523 may change from a high resistance state to a low resistance state or from the low resistance state to the high resistance state according to the voltage applied to the gate 531. The resistance change may be a phenomenon due to oxygen vacancies in the resistance change layer 523, or may be a phenomenon resulting from a change in a current conduction mechanism due to trap/de-trap of electrons.

The resistance change layer 523 may include a material having hysteresis characteristics. For example, the resistance change layer 523 may include a transition metal oxide or a transition metal nitride. Specifically, the resistance change layer 523 may include an oxide or nitride of at least one element selected from the group consisting of zinc (Zn), zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), praseodymium (Pr) and silicon (Si). Also, the resistance change layer 523 may include GeSbTe. The resistance change layer 523 may have a thickness of about 1 nm to about 15 nm.

In addition, an insulating layer 524 may be filled inside the resistance change layer 523. For example, the insulating layer 524 may include a silicon oxide.

The semiconducting layer 522 and the resistance change layer 523 may contact the doping region 510, for example, a common source region.

A drain 540 may be provided on the pillar 520. The drain 540 may include a silicon material doped with a second type. For example, the drain 540 may include the silicon material doped with an n-type.

On the drain 540, a bit line 550 may be provided. The drain 540 and the bit line 550 may be connected through a contact plug. The bit line 550 may include a metal material.

Meanwhile, in comparison with FIG. 4, the plurality of gates 531, the plurality of insulating layers 532, the gate insulating layer 521, the semiconducting layer 522, and the resistance change layer 523 are elements of the cell strings CSs. Specifically, each of the gate 531, the gate insulating layer 521, and the semiconducting layer 522 may be an element of a transistor, and the resistance change layer 523 may be a resistor.

As shown in the figure, because the semiconducting layer 522 of the transistor and the resistance change layer 523 are directly bonded to each other, the resistance change layer 523 may have a high or low resistance state, and thus data may be recorded on a memory cell MC. In each memory cell MC, the semiconducting layer 222 of the transistor and the resistance change layer 523 are connected in parallel, and such parallel structures are continuously arranged in the vertical direction to form the cell string CS. In addition, the common source line 510 and the bit line 550 may be connected to both ends of the cell string CS. Further, write, read, and erase processes may be performed on the plurality of memory cells MCs by applying the voltage to the common source line 510 and the bit line 550.

According to the present disclosure, heat generation and stress (pressure) due to the use of a phase change material may be limited and/or prevented by using the resistance change layer 523 instead of configuring a memory block using the phase change material. In addition, ion movement between adjacent memory cells, leakage current, and operation failure may be limited and/or prevented even when memory cells included in the memory block repeatedly operate by configuring and operating the memory block as described above. Further, the memory block according to the present disclosure may dramatically increasing density by solving a scaling issue between memory cells in a next-generation VNAND.

Meanwhile, the memory block according to the present disclosure may be implemented in the form of a chip and used as a neuromorphic computing platform. Further, the block according to the present disclosure may be implemented in the form of the chip and used to configure a neural network.

Figure 6:
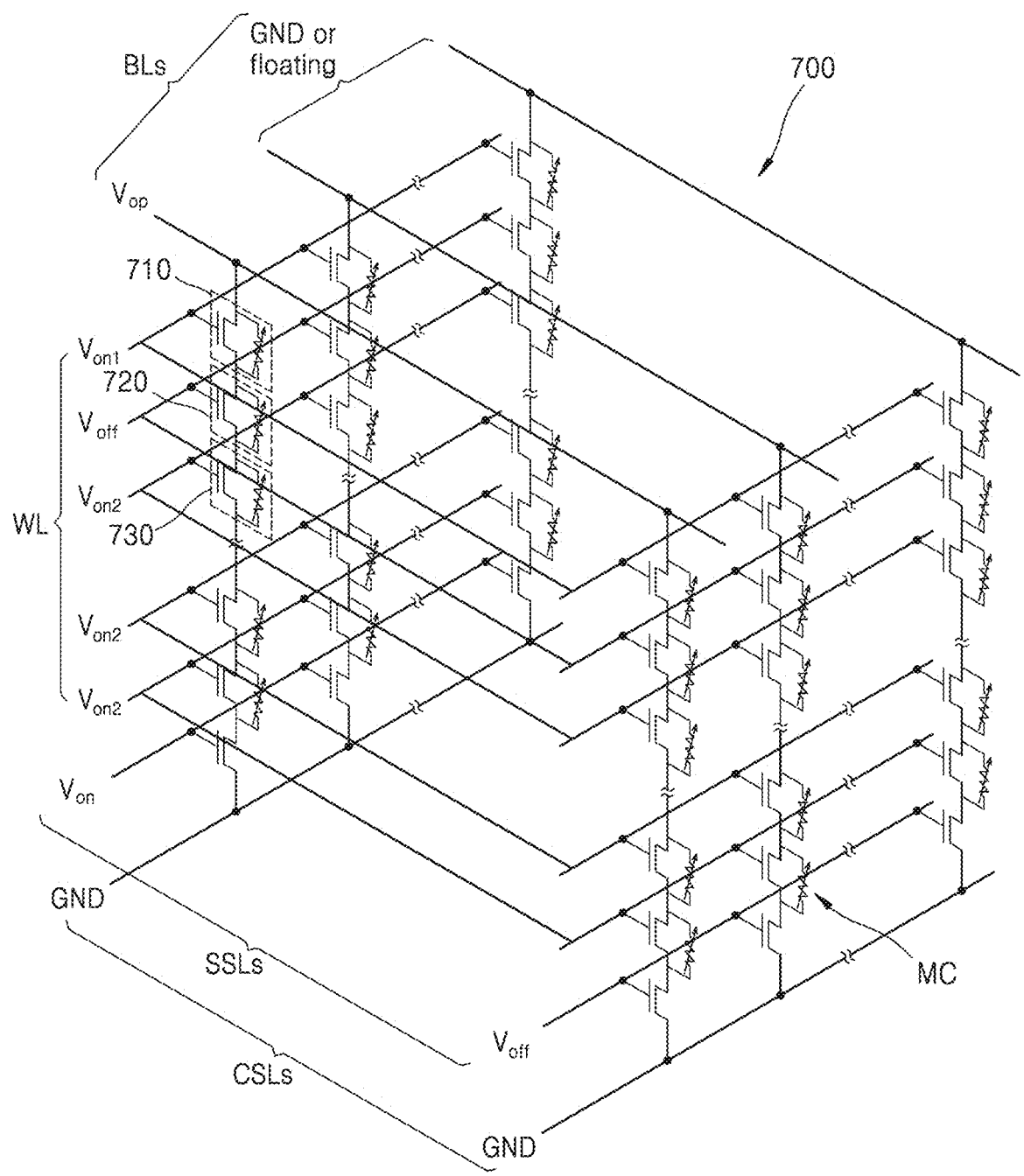
FIG. 6 is a diagram illustrating an equivalent circuit of a nonvolatile memory device according to an embodiment.

FIG. 6 is a diagram illustrating an equivalent circuit of a nonvolatile memory device according to an embodiment. The nonvolatile memory device may operate in any one of a write mode, an erase mode, and a read mode.

A memory cell array 700 may include the plurality of memory cells MC sequentially from the bit lines BLs. Each of the plurality of memory cells MC may include the gate 531, the gate insulating layer 521, the semiconducting layer 522, and the resistance change layer 523 of FIG. 5.

Each of the plurality of memory cells MC may be divided into a selection memory cell 720 and non-selection memory cells 710 and 730. The selection memory cell 720 is a memory cell that is a target of operation, and the non-selection memory cells 710 and 730 are memory cells that are not the target of operation.

In an operation mode, the control logic 220 may control to apply a turn-on voltage to the string selection line SSL connected to the selection memory cell 720 among the plurality of string selection lines SSLs. In addition, the control logic 220 may apply a selection voltage $V_{off}$ to the word line WL connected to the selection memory cell 720, and may apply non-selection voltages $V_{on1}$ and $V_{on2}$ to the word line WL connected to the non-selection memory cells 710 and 730.

The selection voltage $V_{off}$ is a voltage that turns off a transistor, and may also be a voltage that limits and/or prevents current from flowing through the semiconducting layer 522 of the transistor included in the selection memory cell 720. The non-selection voltages $V_{on1}$ and $V_{on2}$ are voltages that turn on the transistor, and may also be voltages that cause current to flow through the semiconducting layer 522 of the transistor included in the non-selection memory cells 710 and 730.

The selection voltage $V_{off}$ and the non-selection voltages $V_{on1}$ and $V_{on2}$ may vary depending on the type and thickness of materials constitute the gate 531, the gate insulating layer 521, the semiconducting layer 522, and the resistance change layer 523 forming the memory cell MC.

In addition, an operation voltage $V_{op}$ may be applied to the bit line BL connected to the selection memory cell 720 among the plurality of bit lines BLs. The above-described operation voltage $V_{op}$ may be provided from the outside, for example, the memory controller 100, through the input/output circuit 240. For example, the operation voltage $V_{op}$ may be a write voltage for writing data to the selection memory cell 720, an erase voltage for erasing the data written to the selection memory cell 720, or a read voltage for reading the data written to the selection memory cell 720. The operation voltage $V_{op}$ may vary depending on the type of operation, the type of data, and physical properties of the memory cell array 700. For example, the write voltage may be about +7V, the erase voltage may be about −7V, and the read voltage may be about +5V.

Among the plurality of bit lines BLs, the bit line BL that is not connected to the selection memory cell 720 may be grounded or floating. Power loss due to leakage current may be limited and/or prevented because the bit lines BLs that are not connected to the selection memory cell 720 are grounded or floating. Accordingly, the control logic 220 may perform an operation on the selection memory cell 720.

In the operation mode, the non-selection voltages $V_{on1}$ and $V_{on2}$ are applied to the non-selection memory cells 710 and 730, the semiconducting layer 522 of the non-selection memory cells 710 and 730 have a conductive characteristic, and as the selection voltage $V_{off}$ is applied to the selection memory cell 720, a semiconducting layer 522b of the selection memory cell 720 has an insulating characteristic. Thus, a voltage difference occurs in the selection memory cell 720 due to the operation voltage $V_{op}$, and oxygen vacancies are moved in a resistance change layer 523b of the selection memory cell 720 or electrons are filled in the trap, the resistance change layer 523b may change from a high resistance state to a low resistance state due to bulk conduction characteristics such as hopping, space charged limited conduction (SCLC), and Poole-Frenkel. Thus, as current flows through the resistance change layer 523b of the selection memory cell 720, data may be written to, erased from, or read from the resistance change layer 523b of the selection memory cell 720.

The selection voltage $V_{off}$ is a voltage that causes the semiconducting layer 522b of the selection memory cell 720 to have insulating characteristics, and may be about −5V to 0V. The selection voltage $V_{off}$ may vary depending on the material characteristics of the semiconducting layer 522.

Meanwhile, the non-selection voltages $V_{on1}$ and $V_{on2}$ are voltages that cause the semiconducting layer 522 of the non-selection memory cells 710 and 730 to have conductive characteristics, and the control logic 220 may apply the non-selection voltages $V_{on1}$ and $V_{on2}$ which are different from each other to the at least two non-selection memory cells 710 and 730 among a plurality of non-selection memory cells that cause the semiconducting layer 522 of the non-selection memory cells 710 and 730 to have different Fermi levels.

Figure 7A:
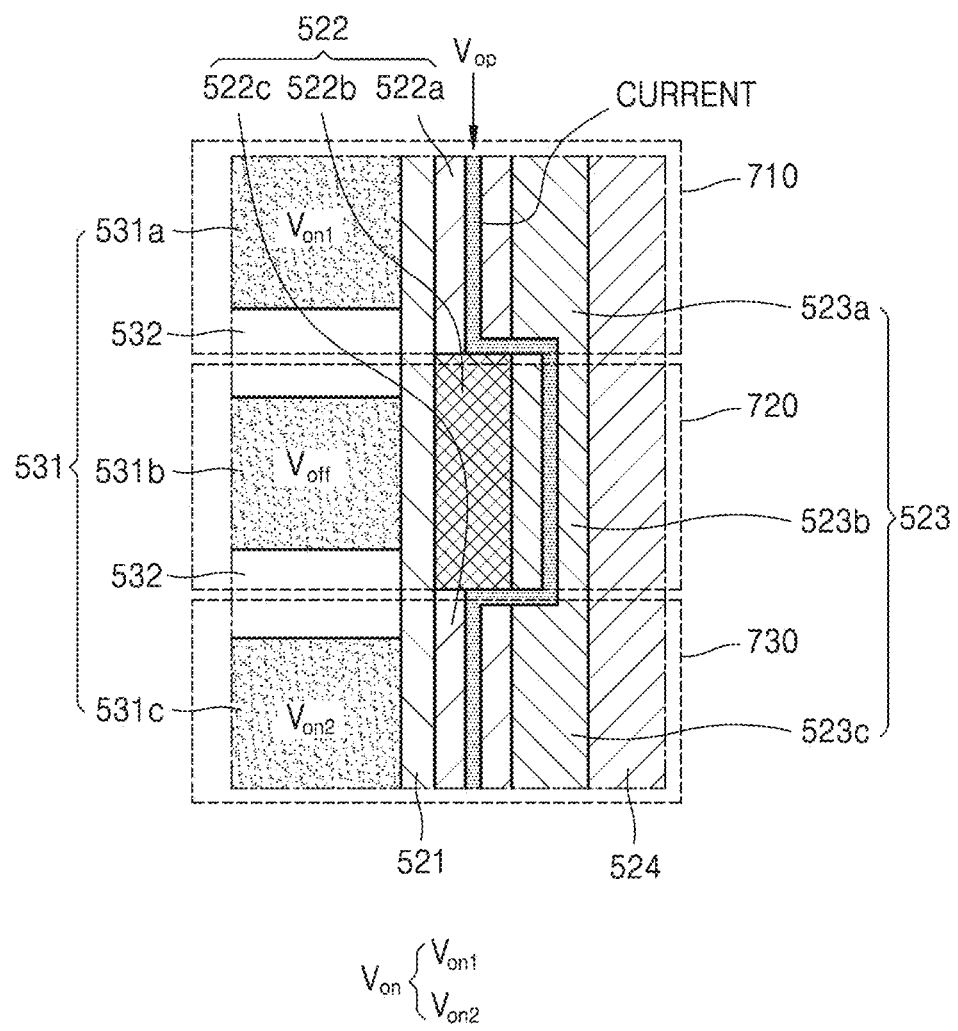
FIG. 7A is a diagram illustrating a current movement between a selection memory cell and non-selection memory cells in an operation mode according to an embodiment.

FIG. 7A is a diagram illustrating a current movement between the selection memory cell 720 and the non-selection memory cells 710 and 730 in an operation mode according to an embodiment.

Referring to FIG. 7A, each of the plurality of memory cells MC included in a memory block may include the gate 531, the gate insulating layer 521, the semiconducting layer 522, and the resistance change layer 523 shown in FIG. 5. The memory cells MC of the memory block may be divided into the selection memory cell 720 and the non-selection memory cells 710 and 730.

In the operation mode, the control logic 220 may apply the selection voltage $V_{off}$ to a gate 531b of the selection memory cell 720, and may respectively apply the non-selection voltages $V_{on1}$ and $V_{on2}$ to gates 531a and 531c of the non-selection memory cells 710 and 730. The control logic 220 may apply the non-selection voltages $V_{on1}$ and $V_{on2}$ which are different from each other to the non-selection memory cells 710 and 730 disposed in different regions with respect to the selection memory cell 720. For example, the control logic 220 may apply the first non-selection voltage $V_{on1}$ to the first non-selection memory cell 710 disposed between the selection memory cell 720 and the bit line BL, and may apply the second non-selection voltage $V_{on2}$ to the second non-selection memory cell 730 disposed between the selection memory cell 720 and a source region.

The first non-selection voltage $V_{on1}$ and the second non-selection voltage $V_{on2}$ may be different from each other. For example, the first non-selection voltage $V_{on1}$ and the second non-selection voltage $V_{on2}$ may have different directions or different absolute values. Alternatively, a difference between the first non-selection voltage $V_{on1}$ and the second non-selection voltage $V_{on2}$ may be greater than a difference between the selection voltage $V_{off}$ and the first non-selection voltage $V_{on1}$ or the selection voltage $V_{off}$ and the second non-selection voltage $V_{on2}$. For example, the difference between the first non-selection voltage $V_{on1}$ and the second non-selection voltage $V_{on2}$ may be about 2V or more (e.g., in a range of about 2V to about 22V, a range of about 2V to about 15V, and/or a range of about 2V to about 8V). Alternatively, the first non-selection voltage $V_{on1}$ may be greater than the selection voltage Von, and the second non-selection voltage $V_{on2}$ may be less than the selection voltage $V_{off}$. The absolute values of the first non-selection voltage $V_{on1}$ and the second non-selection voltage $V_{on2}$ may be greater than the selection voltage $V_{off}$. In addition, the first non-selection voltage $V_{on1}$ and the second non-selection voltage $V_{on2}$ may be set differently.

The semiconducting layer 522 included in a semiconductor memory device according to an embodiment may include an undoped semiconductor material. Thus, the Fermi level may vary from a conduction band to a valence band according to the direction of the first non-selection voltage $V_{on1}$ and the second non-selection voltage $V_{on2}$ applied to a transistor. However, the present disclosure is not limited thereto. The semiconducting layer 522 may be doped with a specific dopant such that the Fermi level may be limited.

Figure 7B:
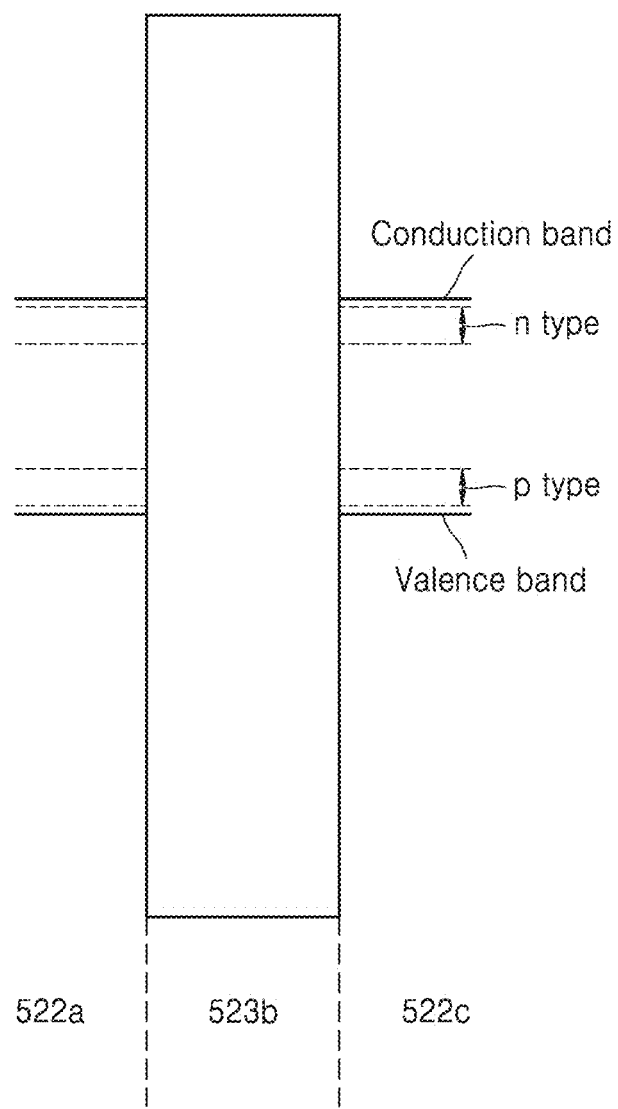
FIG. 7B is a diagram showing a Fermi level between a resistance change layer of a selection memory cell and semiconducting layers of non-selection memory cells.

FIG. 7B is a diagram showing a Fermi level between the resistance change layer 523b of the selection memory cell 720 and semiconducting layers 522a and 522c of the non-selection memory cells 710 and 730. The width of the Fermi level of the semiconducting layers 522a and 522c is smaller than the width of the Fermi level of the resistance change layer 523b. When the Fermi level of the semiconducting layers 522a and 522c is a conduction band, a level having an n-type characteristic, a level having a p-type characteristic, or a valence band, current flows through the semiconducting layers 522a and 522c. In the Fermi level having the conduction band or the n-type characteristic, current flows mainly due to the movement of electrons, and in the Fermi level having the valence band or the p-type characteristic, current flows mainly due to the movement of holes.

Thus, the control logic 220 may apply a voltage that may cause current to flow through the semiconducting layers 522a and 522c of the non-selection memory cells 710 and 730, that is, the non-selection voltages $V_{on1}$ and $V_{on2}$ that cause the Fermi level of the semiconducting layers 522a and 522c to be any one of the conduction band, the level having an n-type characteristic, the level having a p-type characteristic, and the valence band.

The control logic 220 may apply the non-selection voltages $V_{on1}$ and $V_{on2}$ which are different from each other to the first and second non-selection memory cells 710 and 730 such that the first and second non-selection memory cells 710 and 730 have different Fermi levels. A difference in a barrier between the resistance change layer 523b of the selection memory cell 720 and the semiconducting layer 522a (hereinafter, also referred to as "first semiconducting layer") of the first non-selection memory cell 710 or a barrier between the resistance change layer 523b of the selection memory cell 720 and the semiconducting layer 522c (hereinafter referred to as "second semiconducting layer") of the second non-selection memory cell 730 may occur, and thus the difference between the barriers may be reduced by adjusting the Fermi level of the first and second semiconducting layers 522a and 522c. Alternatively, a nonvolatile memory device may be driven with low power by adjusting the Fermi level of the first and second semiconducting layers 522a and 522c.

When the non-selection voltages $V_{on1}$ and $V_{on2}$ are positive voltages, the non-selection voltages $V_{on1}$ and $V_{on2}$ may be equal to or greater than about 0V and equal to or less than about 7V.

Figure 8A:
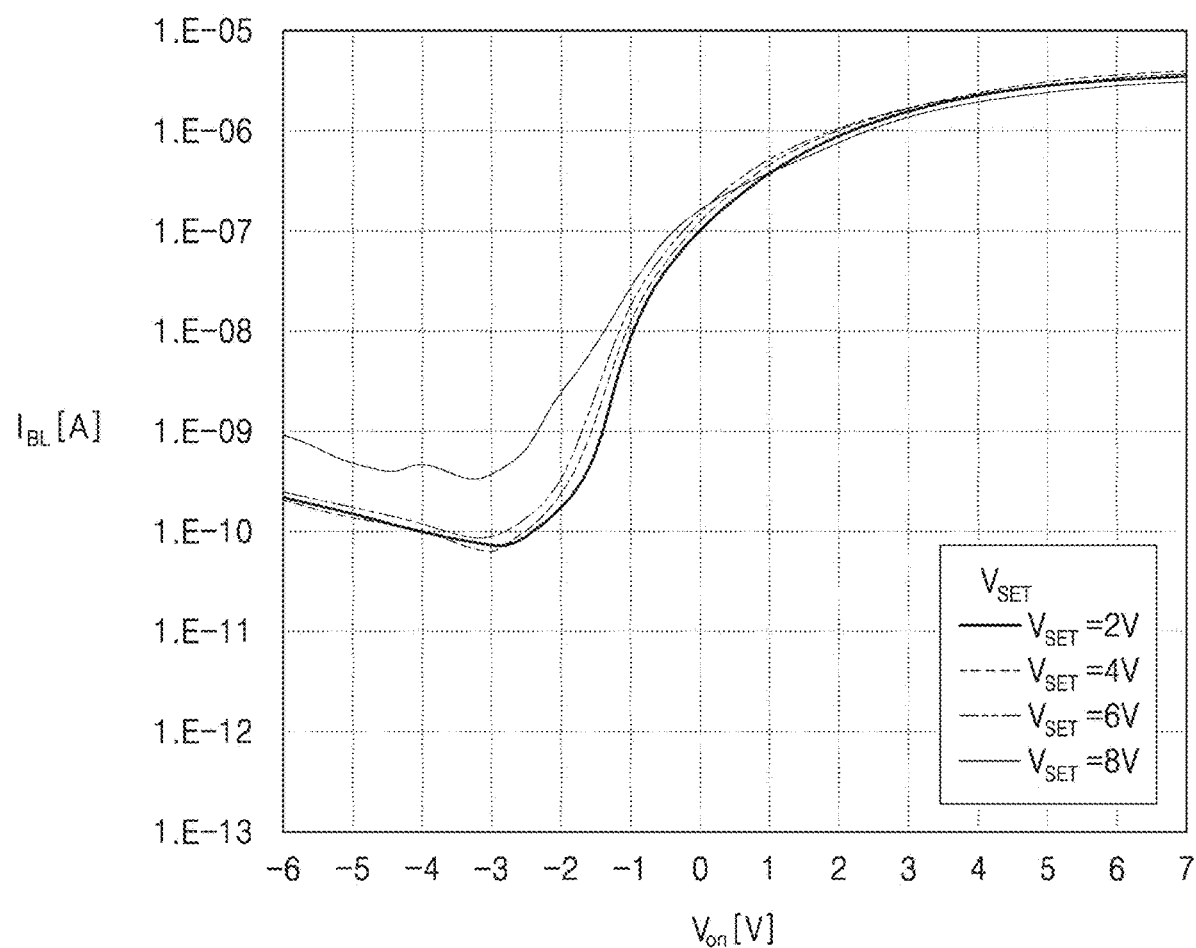
FIG. 8A shows a result of measuring a current value of a bit line with respect to a non-selection voltage in a nonvolatile memory device according to an embodiment.

FIG. 8A shows a result of measuring a current value of the bit line BL with respect to a non-selection voltage Von in a nonvolatile memory device according to an embodiment. The current value of the bit line BL with respect to the non-selection voltage Von is measured while the operation voltage $V_{op}$ is variously set and the selection voltage $V_{off}$ is set to about −4V. As shown in FIG. 8A, it may be seen that the current of the bit line BL also increases in proportion to the positive non-selection voltage Von. In particular, when the non-selection voltage Von is 5V or more, the current of the bit line BL is saturated. This may be expected that when the non-selection voltage Von is 5V or higher, the Fermi level of the semiconducting layer 522 included in the non-selection memory cell is close to a conduction band.

In addition, it may be seen that when the non-selection voltage Von of the non-selection memory cell is equal to or greater than 0V and less than 5V, the current of the bit line BL is proportional to the non-selection voltage Von. It may be expected that the Fermi level of the semiconducting layer 522 included in the non-selection memory cell has the n-type characteristic.

When the non-selection voltage Von is a negative voltage, the non-selection voltage Von may be equal to or greater than about −15V and equal to or less than about −8V.

Figure 8B:
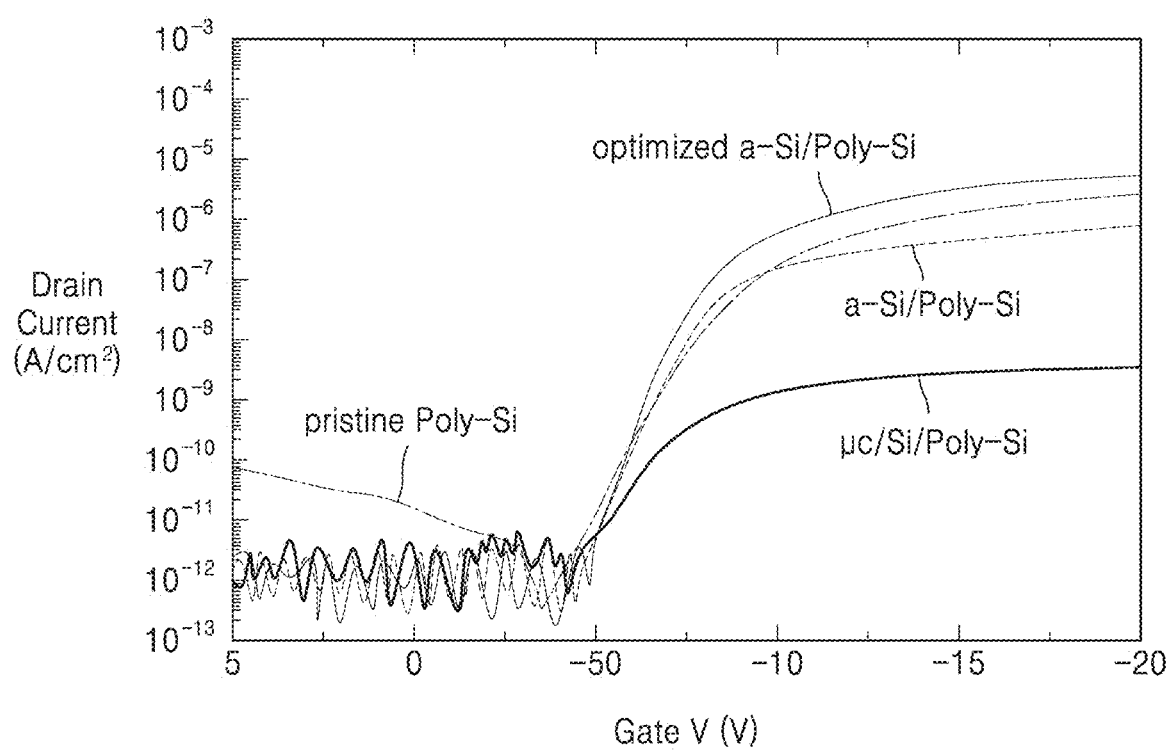
FIG. 8B shows a result of measuring a drain current with respect to a gate voltage in a transistor equivalent to a transistor of a memory cell according to an embodiment.

FIG. 8B shows a result of measuring a drain current with respect to a gate voltage Gate V in a transistor equivalent to a transistor of a memory cell according to an embodiment. In various kinds of semiconductor materials, the drain current value with respect to the gate voltage Gate V of the transistor is measured. As shown in FIG. 8B, it may be seen that the drain current of the transistor is normally measured when the gate voltage Gate V is equal to or less than about −5V. In particular, when the gate voltage Gate V is equal to or less than about −13V, the drain current is saturated. This may be expected that when the gate voltage Gate V is equal to or less than about −13V, the Fermi level of the semiconducting layer 522 included in the transistor is close to a valence band.

In addition, it may be seen that when the gate voltage Gate V is equal to or greater than about −13V and equal to or less than about −8V, the magnitude of the drain current of the transistor is proportional to the absolute value of the gate voltage Gate V. This may be expected that the semiconducting layer 522 of the transistor has the Fermi level having the p-type characteristic.

Meanwhile, when applying the non-selection voltage Von to the non-selection memory cell, the control logic 220 may apply the non-selection voltages $V_{on1}$ and $V_{on2}$ which are different from each other to the non-selection memory cells 710 and 730 which are different from each other such that the Fermi levels are different from each other. For example, the first non-selection voltage $V_{on1}$ may be applied to the first non-selection memory cell 710 between the selection memory cell 720 and the bit line BL, and the second non-selection voltage $V_{on2}$ may be applied to the second non-selection memory cell 730 between the selection memory cell 720 and the source line.

The first non-selection voltage $V_{on1}$ may be a voltage such that the Fermi level of the first semiconducting layer 522a is any one of a conduction band, an n-type characteristic, a p-type characteristic, and a valence band, and the second non-selection voltage $V_{on2}$ may be a voltage such that a Fermi level different from the Fermi level formed according to the first non-selection voltage $V_{on1}$ is formed in the second semiconducting layer 522c. The first non-selection voltage $V_{on1}$ may be a voltage such that the Fermi level of the first semiconducting layer 522a has the n-type characteristic or the conduction band characteristic, and the second non-selection voltage $V_{on2}$ may be a voltage such that the Fermi level of the second semiconducting layer 522c has the p-type characteristic or the valence band characteristic. Or vice versa. In addition, the magnitude of the first non-selection voltage $V_{on1}$ and the second non-selection voltage $V_{on2}$ may be variously set according to the operation of a nonvolatile memory device.

As described above, the Fermi level of the semiconducting layer 522 included in the non-selection memory cells comprising the first and second non-memory cells 710 and 730 is adjusted by applying the non-selection voltages $V_{on1}$ and $V_{on2}$ which are different from each other to the at least two non-selection memory cells among the plurality of non-selection memory cells, the switching behavior of the transistors included in the non-selection memory cells may be adjusted. For example, a low power operation of the memory device may be induced by increasing a barrier between the semiconducting layers 522a and 522c included in the non-selection memory cells 710 and 730 and the resistance change layer 523b included in the selection memory cell 720 and suppressing current flow, and the self-rectifying phenomenon of the memory device may be removed by reducing a difference in a barrier between the semiconducting layers 522a and 522c adjacent to the resistance change layer 523b.

Figure 9A:
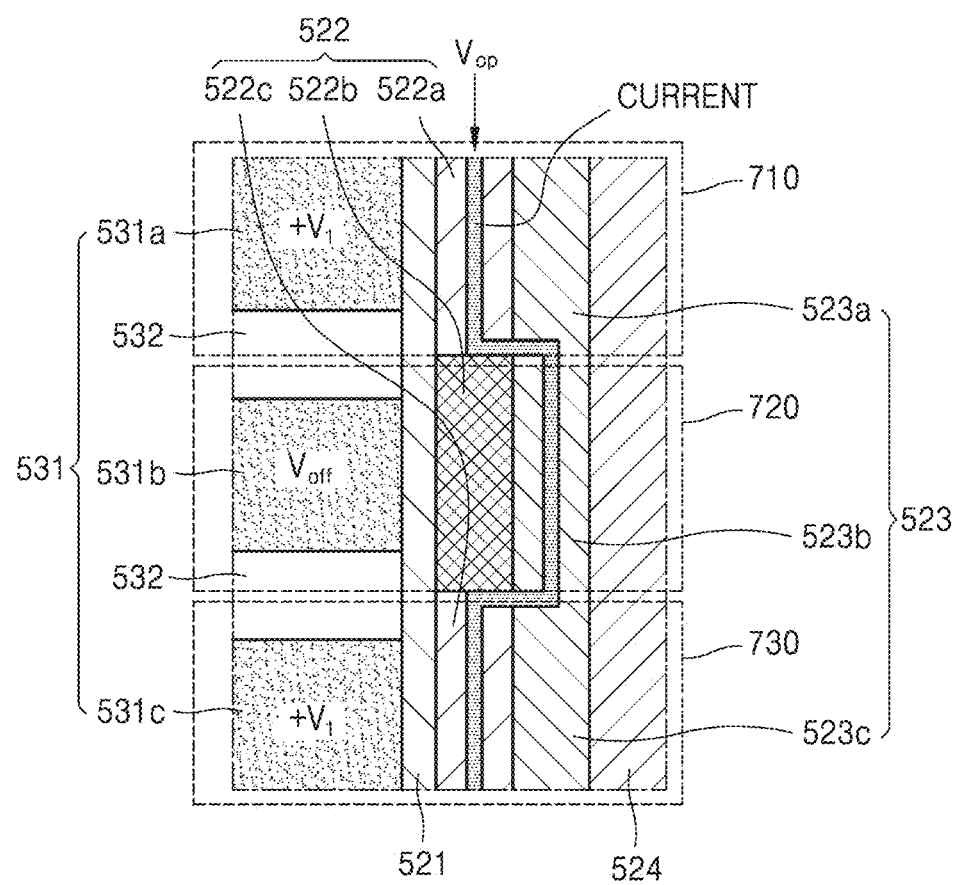
FIG. 9A is a diagram related to a current movement when the same non-selection voltage is applied to non-selection memory cells.
Figure 9B:
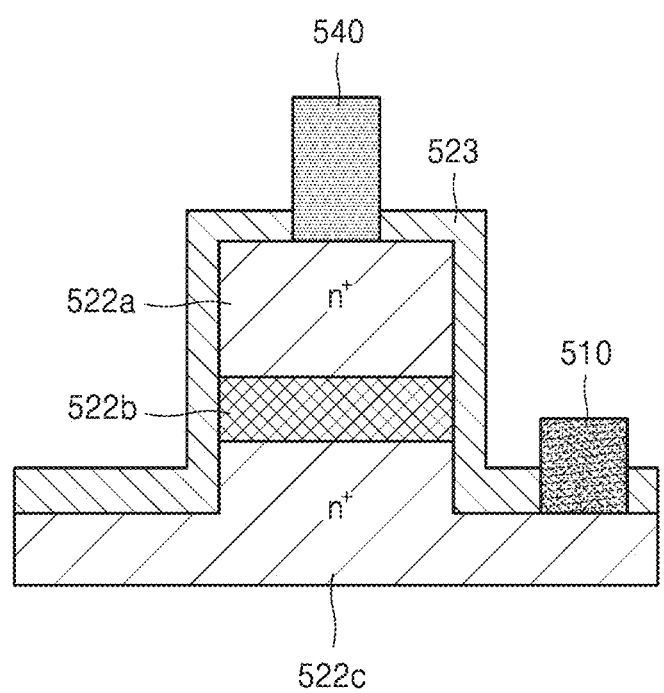
FIG. 9B shows a resistance change element equivalent to a device shown in FIG. 9A.
Figure 9C:
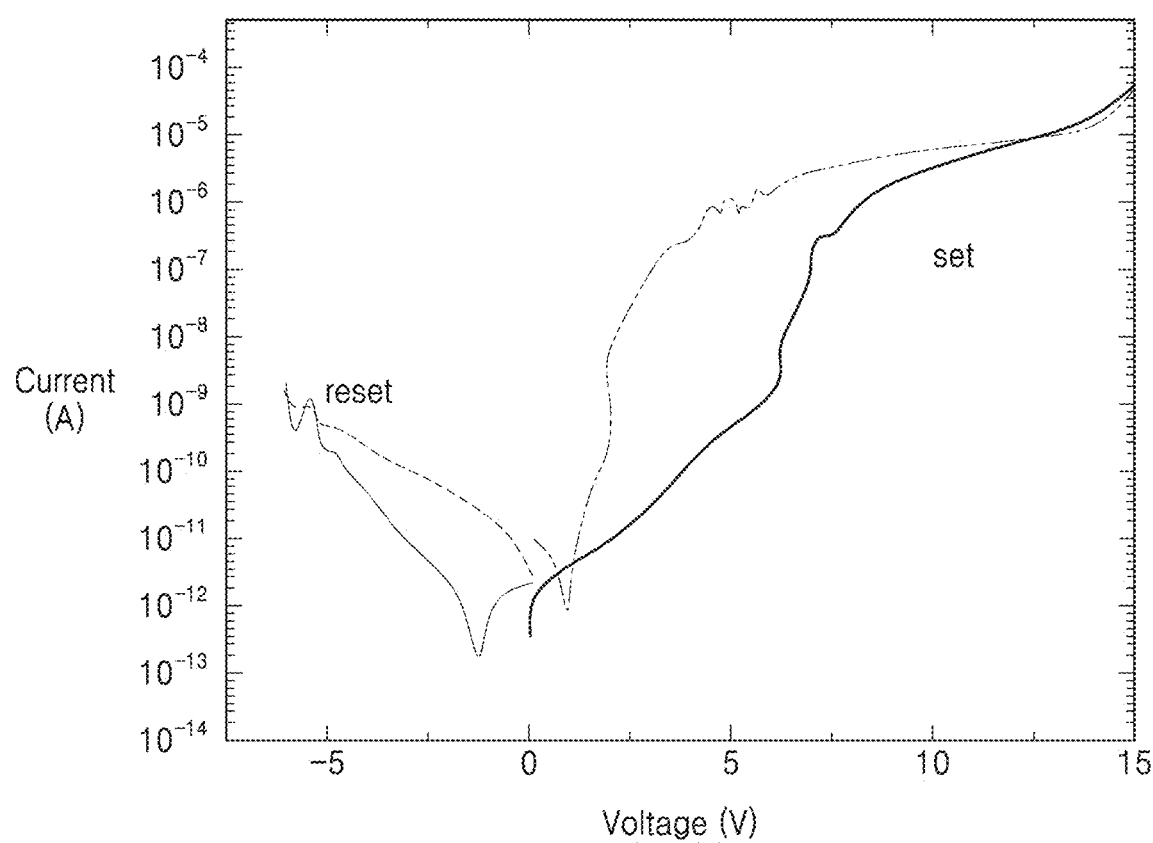
FIG. 9C is a graph showing IV characteristics of the resistance change element of FIG. 9B.
Figure 9D:
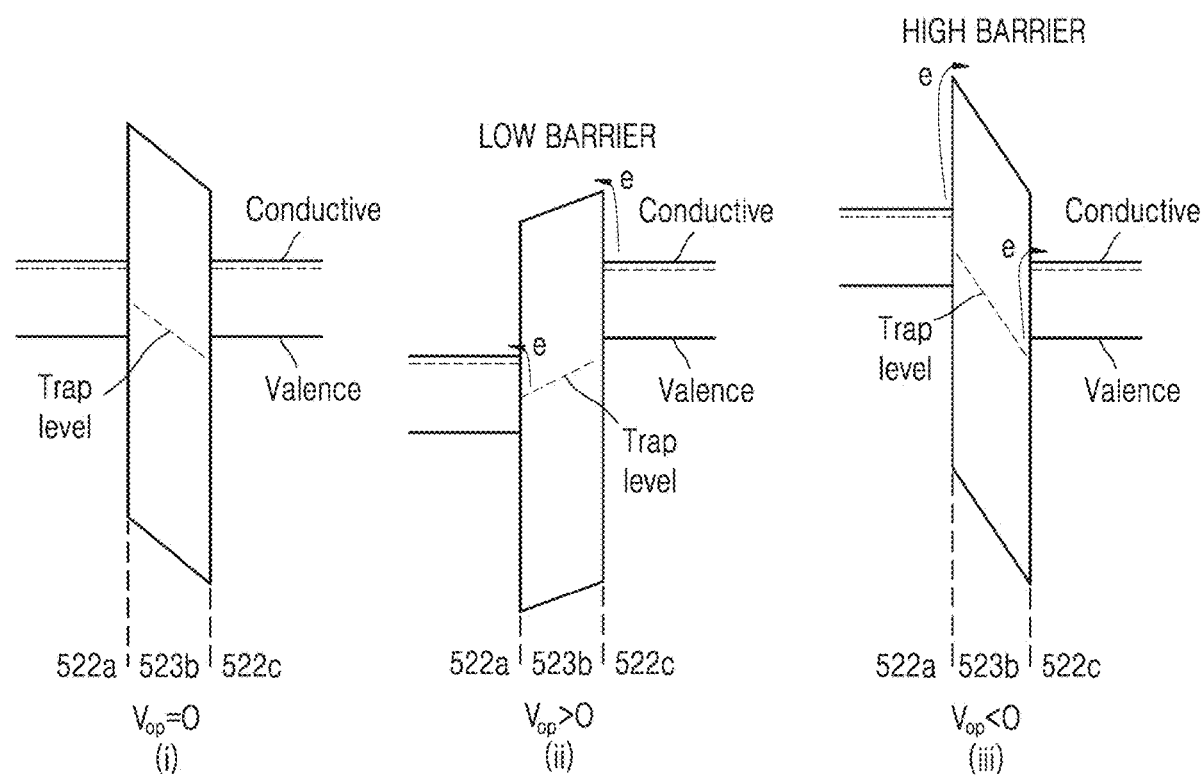
FIG. 9D shows the Fermi levels of semiconducting layers and a resistance change layer inferred from FIG. 9C.

FIG. 9A is a diagram related to a current movement when the same non-selection voltage $+V_1$ is applied to the non-selection memory cells 710 and 730, and FIG. 9B shows a resistance change element equivalent to a device shown in FIG. 9A. In addition, FIG. 9C is a graph showing the IV characteristics of the resistance change element of FIG. 9B, and FIG. 9D shows the Fermi level of the semiconducting layers 522a and 522c and the resistance change layer 523b inferred from FIG. 9C.

When the same non-selection voltage $+V_1$ is applied to the non-selection memory cells 710 and 730, the semiconducting layer 522 of the non-selection memory cells 710 and 730 with the semiconducting layer 522b of the selection memory cell 720 interposed therebetween may have the Fermi level of the same type. For example, as shown in FIG. 9A, when the positive non-selection voltage +V1 is applied to the non-selection memory cells 710 and 730, as shown in FIG. 9B, the semiconducting layers 522a and 522c of the non-selection memory cells 710 and 730 have characteristics doped with an n-type dopant.

The selection voltage $V_{off}$ is applied to the selection memory cell 720, and thus the semiconducting layer 522b of the selection memory cell 720 has the insulating characteristic. Meanwhile, when the operation voltage $V_{op}$ is applied to the bit line BL, because the semiconducting layer 522b of the selection memory cell 720 has the insulating characteristic, the current will flow through the resistance change layer 523b of the selection memory cell 720.

A voltage of about +7 V is applied to the first and second non-selection memory cells 710 and 730, and a voltage of about −4 V is applied to the selection memory cell 720. Without setting the compliance current, the IV characteristics are obtained by sweeping the operation voltage $V_{op}$ by 15V toward the positive voltage and resetting the element, and sweeping the operation voltage $V_{op}$ by −6V toward the negative voltage and resetting the element. As shown in FIG. 9C, it may be confirmed that the element does not break down even without setting the compliance current and stably switches while performing a self-compliance behavior.

In addition, upon comparing a positive voltage graph and a negative voltage graph, it may be seen that the current level is significantly lower on the negative voltage side, and the self-rectifying phenomenon occurs. This self-rectifying phenomenon results from a difference in a barrier between the first semiconducting layer 522a and the resistance change layer 523b (hereinafter, also referred to as "resistance change layer") of the selection memory cell 720 and a barrier between the second semiconducting layer 522c and the resistance change layer 523b.

From the IV characteristic of FIG. 9C, the Fermi level of the resistance change element may be expected as shown in FIG. 9D. When the operation voltage $V_{op}$ is not applied to the bit line BL, it may be expected that Fermi levels of the same magnitude are formed in the first and second semiconducting layers 522a and 522c as shown in (i) of FIG. 9D. In addition, it may be expected from the self-rectifying phenomenon that there will be the difference in the barrier between the first semiconducting layer 522a and the resistance change layer 523b and the barrier between the second semiconducting layer 522c and the resistance change layer 523b. This phenomenon may be due to experimental Fermi level pinning.

When the positive operation voltage $V_{op}$ is applied to the bit line BL, as shown in (ii) of FIG. 9D, electrons of the second semiconducting layer 522c cross a relatively low barrier between the resistance change layer 523b and the second semiconducting layer 522c, move into the resistance change layer 523b, and fill the trap level of the resistance change layer 523b. When the trap level is filled, electrons flow through the low barrier between the resistance change layer 523b and the first semiconducting layer 522a to the first semiconducting layer 522a. The charge movement mechanism may be a SCLC.

When the negative operation voltage $V_{op}$ is applied to the bit line BL, as shown in (iii) of FIG. 9D, electrons of the first semiconducting layer 522a cross a relatively high barrier between the first semiconducting layer 522a and the resistance change layer 523b, move into the resistance change layer 523b, and an electron movement may be limited. Thus, conduction may occur through F-N tunneling in a high field state. As described above, a barrier difference between the resistance change layer 523b and the semiconducting layers 522a and 522c may occur depending on the direction of the operation voltage $V_{op}$, and thus the conduction mechanism may change.

Figure 10A:
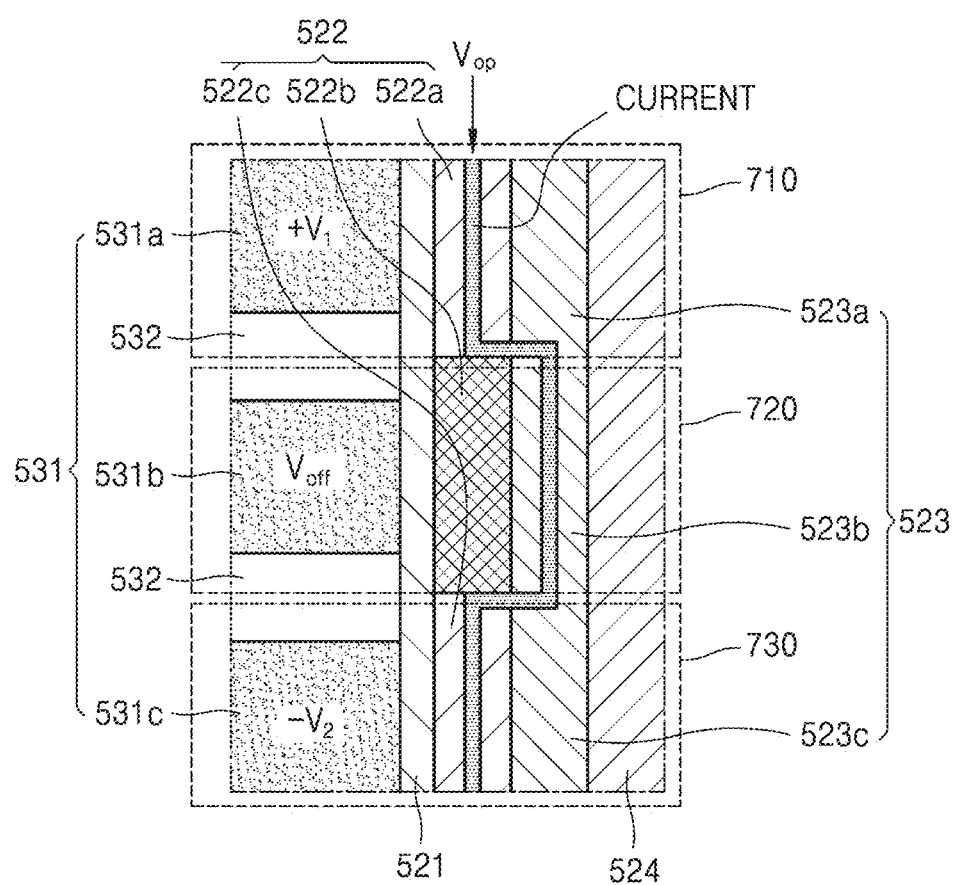
FIG. 10A is a diagram related to a current movement when non-selection voltages of different directions are applied to non-selection memory cells.
Figure 10B:
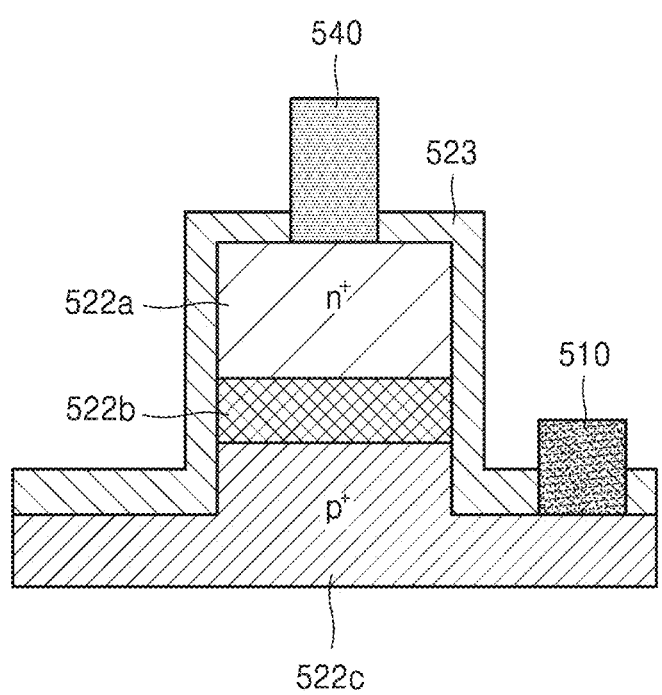
FIG. 10B shows a resistance change element equivalent to a device shown in FIG. 10A.
Figure 10C:
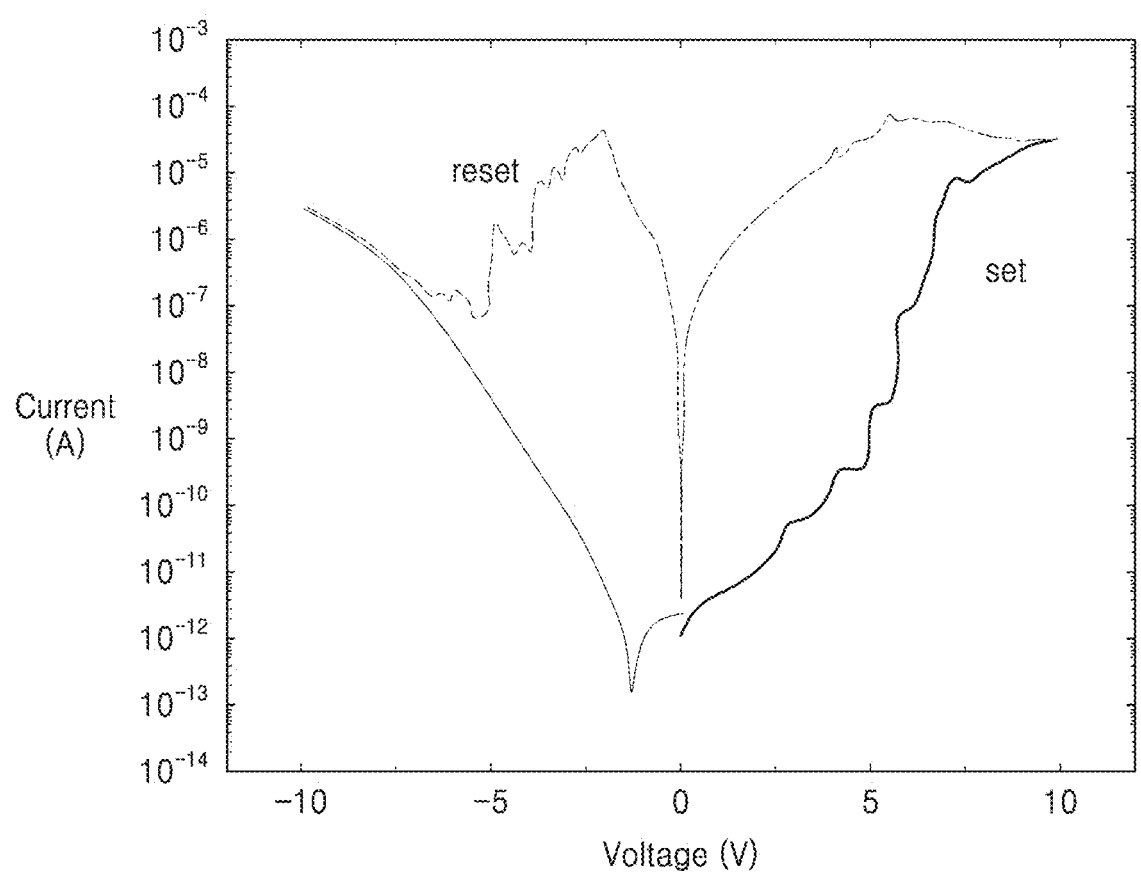
FIG. 10C is a graph showing IV characteristics of the resistance change element of FIG. 10B.
Figure 10D:
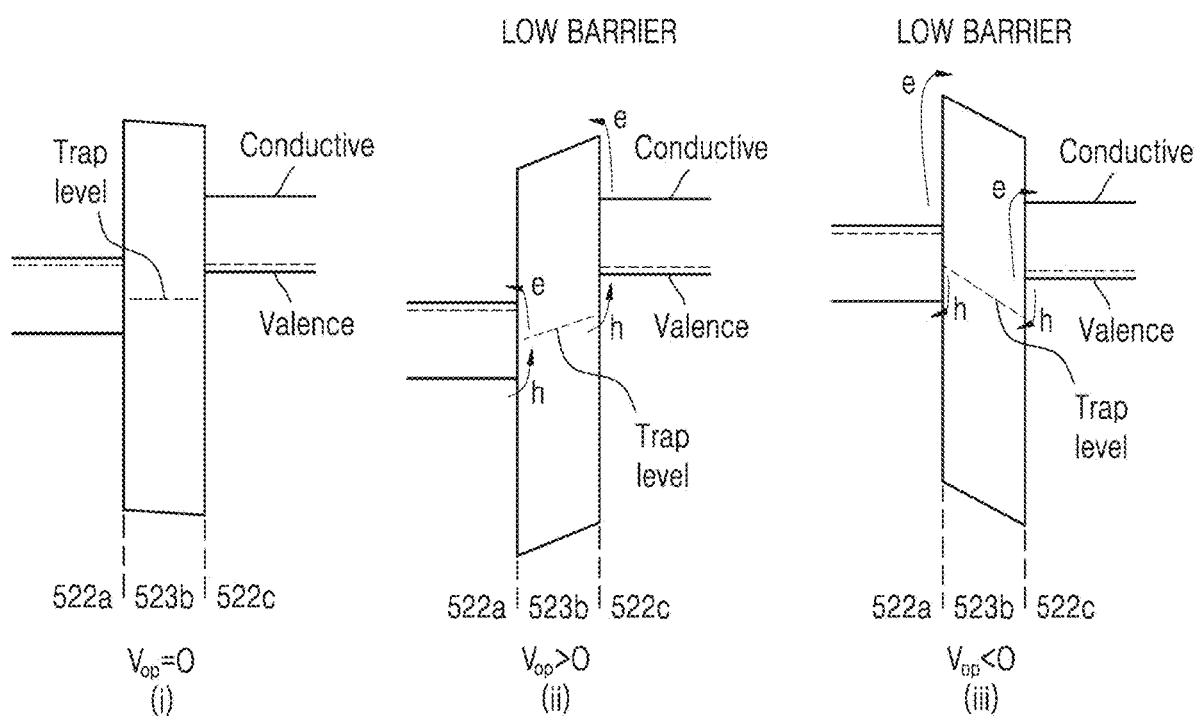
FIG. 10D shows the Fermi levels of semiconducting layers and a resistance change layer inferred from FIG. 10C.

FIG. 10A is a diagram related to a current movement when non-selection voltages $+V_1$ and $-V_2$ of different directions are applied to the non-selection memory cells 710 and 730 and FIG. 10B shows a resistance change element equivalent to a device shown in FIG. 10A; FIG. 10C is a graph showing the IV characteristics of the resistance change element of FIG. 10B and FIG. 10D shows the Fermi levels of the semiconducting layers 522a and 522c and the resistance change layer 523b inferred from FIG. 10C.

When the non-selection voltages $+V_1$ and $-V_2$ of different directions are applied to the non-selection memory cells 710 and 730, the semiconducting layer 522 of the non-selection memory cells 710 and 730 with the semiconducting layer 522b of the selection memory cell 720 interposed therebetween may have semiconductor characteristics doped with different dopants. For example, as shown in FIG. 10A, the positive non-selection voltage +V1 may be applied to the first non-selection memory cell 710, and the negative non-selection voltage −V$_2$ may be applied to the second non-selection memory cell 730. As shown in FIG. 10B, the first semiconducting layer 522a may have characteristics doped with an n-type dopant and the second semiconducting layer 522c may have characteristics doped with an p-type dopant The selection voltage V$_{off}$ is applied to the selection memory cell 720, and thus the semiconducting layer 522b of the selection memory cell 720 has the insulating characteristic.

Meanwhile, when the operation voltage V$_{op}$ is applied to the bit line BL, because the semiconducting layer 522b of the selection memory cell 720 has the insulating characteristic, the current will flow through the resistance change layer 523b of the selection memory cell 720.

A voltage of about +7 V is applied to the first non-selection memory cell 710, a voltage of about −10V is applied to the second non-selection memory cell 730, and a voltage of about −4 V is applied to the selection memory cell 720. Without setting the compliance current, the IV characteristics are obtained as shown in FIG. 10C by sweeping the operation voltage V$_{op}$ by 10V toward the positive voltage and resetting the element, and sweeping the operation voltage V$_{op}$ by −10V toward the negative voltage and resetting the element.

As shown in FIG. 10C, it may be confirmed that the element does not break down even without setting the compliance current and stably switches while performing a self-compliance behavior.

In addition, upon comparing a positive voltage graph and a negative voltage graph, it may be seen that the symmetrical current level occurs and the self-rectifying phenomenon occurs. This may be expected that there is little difference in a barrier between the first semiconducting layer 522a and the resistance change layer 523b and a barrier between the second semiconducting layer 522c and the resistance change layer 523. Thus, it may be expected that the conduction mechanism is the same regardless of the direction of the operation voltage V$_{op}$. For example, the charge movement mechanism may be a SCLC.

From the IV characteristic of FIG. 10C, the Fermi level of the resistance change element may be expected as shown in FIG. 10D. When the operation voltage V$_{op}$ is not applied to the bit line BL, it may be expected that Fermi levels of different magnitude are formed in the first and second semiconducting layers 522a and 522c as shown in (i) of FIG. 10D.

When the positive operation voltage V$_{op}$ is applied to the bit line BL, as shown in (ii) of FIG. 10D, the barrier between the first semiconducting layer 522a and the resistance change layer 523 and the barrier between the resistance change layer 523 and the second semiconducting layer 522c may be low. Thus, electrons may sequentially move from the second semiconducting layer 522c to the resistance change layer 523 and the first semiconducting layer 522a, and holes may sequentially move from the first semiconducting layer 522a to the resistance change layer 523 and the second semiconducting layer 522c.

Figure 11A:
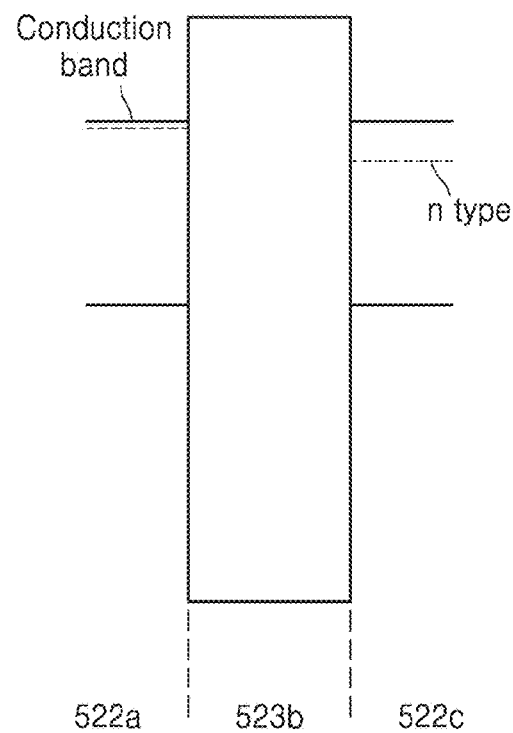
FIGS. 11A to 11C are diagrams illustrating Fermi levels of semiconducting layers and a resistance change layer according to an embodiment.
Figure 11B:
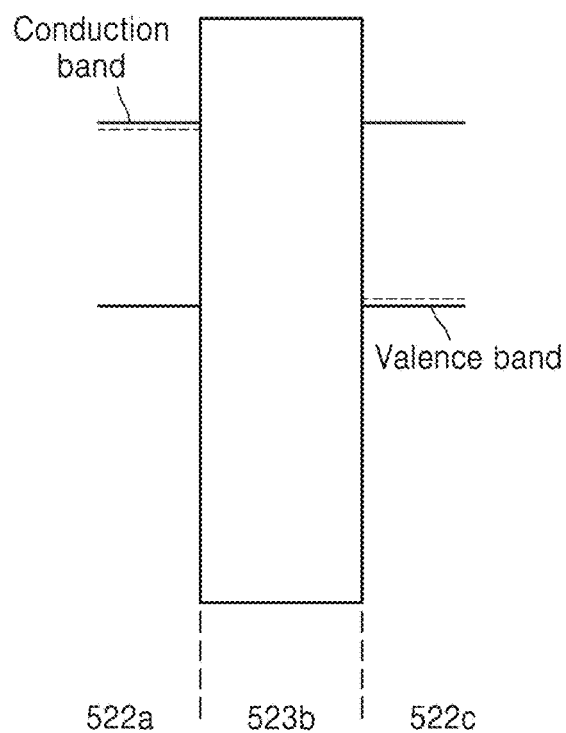
Figure 11C:
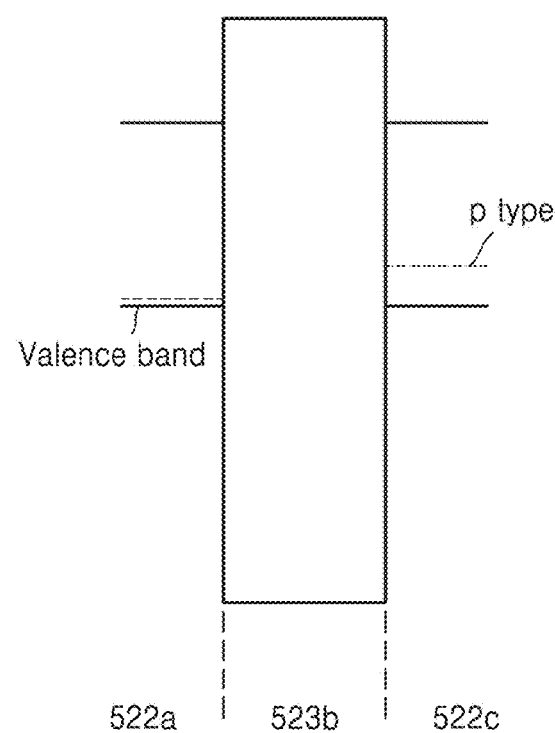

When the negative operation voltage V$_{op}$ is applied to the bit line BL, as shown in (iii) of FIG. 10D, the barrier between the first semiconducting layer 522a and the resistance change layer 523 and the barrier between the resistance change layer 523 and the second semiconducting layer 522c may be low. Thus, electrons may sequentially move from the first semiconducting layer 522a to the resistance change layer 523 and the second semiconducting layer 522c, and holes may sequentially move from the second semiconducting layer 522c to the resistance change layer 523 and the first semiconducting layer 522a. FIGS. 11A to 11C are diagrams illustrating Fermi levels of first and second semiconducting layers 522a and 522c and the resistance change layer 523b according to an embodiment.

As shown in FIG. 11A, the control logic 220 may apply the first non-selection voltage V$_{on1}$ to the first non-selection memory cell 710 such that the Fermi level of the first semiconducting layer 522a is a conduction band, and may apply the second non-selection voltage V$_{on2}$ to the second non-selection memory cell 730 such that the Fermi level of the second semiconducting layer 522c has an n-type dopant characteristic. Because a difference in the Fermi level between the first and second non-selection voltages V$_{on1}$ and V$_{on2}$ is small, a semiconductor device may have a weak rectifying behavior. The Fermi levels of the first semiconducting layer 522a and the second semiconducting layer 522c may be opposite to each other. Alternatively, the non-selection voltages V$_{on1}$ and V$_{on2}$ may be applied such that the first semiconducting layer 522a has the Fermi level of a valence band and the Fermi level of the second semiconducting layer 522c has a p-type dopant characteristic.

The Fermi levels may be formed in the first and second semiconducting layers 522a and 522c such that charges of different types are main carriers in the first semiconducting layer 522a and the second semiconducting layer 522c. For example, as shown in FIG. 11B, the control logic 220 may apply the first non-selection voltage V$_{on1}$ such that the Fermi level of the first semiconducting layer 522a is the conduction band, and may apply the second non-selection voltage V$_{on2}$ such that the Fermi level of the second semiconducting layer 522c is the valence band. As the difference between the Fermi levels of the first and second semiconducting layers 522a and 522c increases, a nonvolatile memory device may perform a strong rectifying behavior.

The non-selection voltages V$_{on1}$ and V$_{on2}$ may be applied to the non-selection memory cells 710 and 730 such that barriers between the semiconducting layers 522a and 522c and the resistance change layer 523 are high. For example, as shown in FIG. 11C, the control logic 220 may apply the first non-selection voltage V$_{on1}$ such that the Fermi level of the first semiconducting layer 522a is the valence band, and may apply the second non-selection voltage V$_{on2}$ such that the Fermi level of the second semiconducting layer 522c has the p-type characteristic. When the barrier between the first semiconducting layer 522a and the resistance change layer 523 and the barrier between the second semiconducting layer 522c and the resistance change layer 523 are high, a carrier movement from the semiconducting layers 522 to the resistance change layer 523 is difficult, and thus low power driving may be possible.

As described above, low power driving is possible and the self-rectifying phenomenon may be removed by adjusting the magnitude of the non-selection voltage. The non-selection voltage may be adjusted differently depending on an operation mode.

Figure 12:
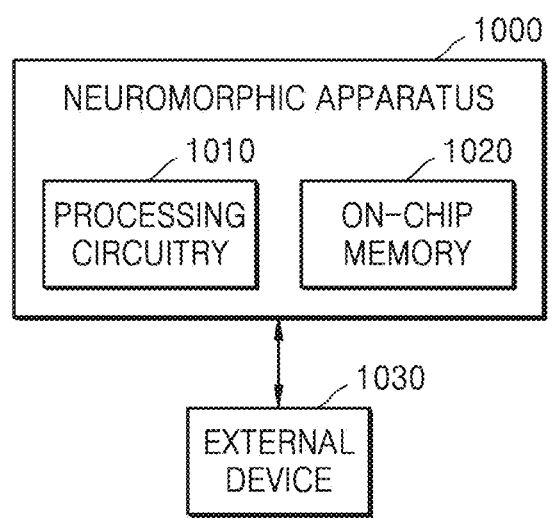
FIG. 12 is a schematic block diagram of a neuromorphic device including a memory device, according to an embodiment.

In some embodiments, the memory block and/or nonvolatile memory device described above may be realized in the form of a chip and may be used as a neuromorphic computing platform. For example, FIG. 12 is a schematic view of a neuromorphic device 1000 including a memory device, according to an embodiment. Referring to FIG. 12, the neuromorphic device 1000 may include processing circuitry 1010 and/or a memory 1020. The memory 1020 of the neuromorphic device 1000 may include the memory system 10 according to an embodiment.

In some example embodiments, processing circuitry 1010 may be configured to control functions for driving the neuromorphic apparatus 1000. For example, the processing circuitry 1010 may be configured to control the neuromorphic apparatus 1000 by executing programs stored in the memory 1020 of the neuromorphic apparatus 1000. In some example embodiments, the processing circuitry may include hardware such as logic circuits; a hardware/software combination, such as a processor executing software; or a combination thereof. For example, a processor may include, but is not limited to, a central processing unit (CPU), a graphics processing unit (GPU), an application processor (AP) included in the neuromorphic device, an arithmetic logic unit (ALU), a digital signal processor, a microcomputer, a field programmable gate array (FPGA), a System-on-Chip (SoC), a programmable logic unit, a microprocessor, application-specific integrated circuit (ASIC), or the like. In some example embodiments, the processing circuitry 1010 may be configured to read/write various data from/in the external device 1030 and/or execute the neuromorphic apparatus 1000 by using the read/written data. In some embodiments, the external device 1030 may include an external memory and/or sensor array with an image sensor (e.g., CMOS image sensor circuit).

Referring to FIGS. 1-2, the memory controller 100, write/read controller 110, voltage controller 120, and data determiner 130, voltage generator 222, control logic 220, row decoder 224, and input/output circuit 230 also may be implemented with processing circuitry. The memory controller 100, in conjunction with the write/read controller 110, voltage controller 120, data determiner 130, and input/output circuit 230 may operate based on control signals for controlling operations of the memory device 200 discussed herein, thereby transforming the memory controller 100—and write/read controller 110, voltage controller 120, and data determiner 130 therein—control logic 220 and input output circuit 230 into special purpose processing circuitry for controlling operations of the memory device 200 discussed herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A nonvolatile memory device comprising:
  a memory cell array including a first memory cell, a second memory cell, and a third memory cell sequentially arranged in a vertical stack structure;
  a control logic configured to select the second memory cell as a selection memory cell by applying a first non-selection voltage to the first memory cell, applying a second non-selection voltage different from the first non-selection voltage to the third memory cell, and applying a selection voltage to the second memory cell; and
  a bit line connected to the memory cell array, the bit line configured to apply an operation voltage to the memory cell array,
  wherein the first non-selection voltage and the second non-selection voltage have different signs.

2. The nonvolatile memory device of claim 1, wherein the control logic is further configured to apply the first non-selection voltage and the second non-selection voltage to the first memory cell and the third memory cell, respectively, such that a Fermi level of a semiconducting layer included in the first memory cell differs from a Fermi level of a semiconducting layer included in the third memory cell in response to the first non-selection voltage being applied to the first memory cell and the second non-selection voltage being applied to the second memory cell.

3. The nonvolatile memory device of claim 1, wherein a difference between the first non-selection voltage and the second non-selection voltage is less than a difference between the first non-selection voltage and the selection voltage.

4. The nonvolatile memory device of claim 1, wherein a difference between the first non-selection voltage and the second non-selection voltage is greater than or equal to about 2V.

5. The nonvolatile memory device of claim 1, wherein the first non-selection voltage and the second non-selection voltage have different absolute values.

6. The nonvolatile memory device of claim 1, wherein the first non-selection voltage is greater than or equal to 0V and less than or equal to about 7V.

7. The nonvolatile memory device of claim 1, wherein the second non-selection voltage is greater than or equal to about −15V and less than or equal to about −8V.

8. The nonvolatile memory device of claim 1, wherein the selection voltage is less than the first non-selection voltage and greater than the second non-selection voltage.

9. The nonvolatile memory device of claim 1, wherein an absolute value of the selection voltage is less than absolute values of the first non-selection voltage and the second non-selection voltage.

10. The nonvolatile memory device of claim 1, wherein the first memory cell, the second memory cell, and the third memory cell are connected in series while being sequentially farther away from the bit line.

11. The nonvolatile memory device of claim 1, wherein the operation voltage is a write voltage for writing data to the second memory cell or an erase voltage for erasing the data written to the second memory cell, and
  the write voltage and the erase voltage have different signs, and
  an absolute value of the write voltage is the same as an absolute value of the erase voltage.

12. The nonvolatile memory device of claim 1, wherein the memory cell array comprises:
  a semiconducting layer extending in a first direction;
  a plurality of gates and a plurality of insulating layers extending in a second direction perpendicular to the first direction and alternately disposed with each other;
  a gate insulating layer extending in the first direction between the plurality of gates, the plurality of insulating layers, and the semiconducting layer; and
  a resistance change layer extending in the first direction on the semiconducting layer.

13. The nonvolatile memory device of claim 12, wherein the semiconducting layer and the resistance change layer are connected in parallel to each other.

14. The nonvolatile memory device of claim 12, wherein the resistance change layer is in contact with the semiconducting layer.

15. The nonvolatile memory device of claim 12, wherein the semiconducting layer is not doped with a dopant.

16. The nonvolatile memory device of claim 12, wherein the resistance change layer has a hysteresis characteristic.

17. The nonvolatile memory device of claim 12, wherein the resistance change layer comprises at least one of a transition metal oxide and a transition metal nitride.

18. An operating method of a nonvolatile memory device comprising a memory cell array including a first memory cell, a second memory cell, and a third memory cell sequentially arranged in a vertical stack structure, the operating method comprising:

selecting the second memory cell as a selection memory cell by applying a first non-selection voltage to the first memory cell, applying a second non-selection voltage different from the first non-selection voltage to the third memory cell, and applying a selection voltage to the second memory cell; and applying an operation voltage to the memory cell array, the operation being a write operation, an erase operation, and or a read operation, wherein the first non-selection voltage and the second non-selection voltage have different signs.

19. The operating method of claim 18, wherein the first non-selection voltage and the second non-selection voltage have magnitudes such that a semiconducting layer included in the first memory cell and a semiconducting layer included in the third memory cell have different Fermi levels.

* * * * *